(12) United States Patent
Chang et al.

(10) Patent No.: US 8,890,261 B2
(45) Date of Patent: Nov. 18, 2014

(54) FIN FIELD EFFECT TRANSISTOR DEVICES WITH SELF-ALIGNED SOURCE AND DRAIN REGIONS

(71) Applicant: International Business Machines Corporation, Armonk, NY (US)

(72) Inventors: Josephine B. Chang, Mahopac, NY (US); Michael A. Guillorn, Yorktown Heights, NY (US); Wilfried Haensch, Somers, NY (US); Katherine Lynn Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/056,853

(22) Filed: Oct. 17, 2013

(65) Prior Publication Data

US 2014/0042556 A1 Feb. 13, 2014

Related U.S. Application Data

(60) Continuation of application No. 12/544,939, filed on Aug. 20, 2009, now Pat. No. 8,592,280, which is a division of application No. 11/765,931, filed on Jun. 20, 2007, now Pat. No. 7,923,337.

(51) Int. Cl.
*H01L 27/088* (2006.01)
*H01L 29/78* (2006.01)
*H01L 29/66* (2006.01)

(52) U.S. Cl.
CPC .......... *H01L 27/0886* (2013.01); *H01L 29/785* (2013.01); *H01L 29/66553* (2013.01); *H01L 29/66795* (2013.01); *H01L 29/7854* (2013.01); *H01L 29/66545* (2013.01); *Y10S 977/938* (2013.01)

USPC .................. 257/401; 257/327; 257/E29.255; 977/938

(58) Field of Classification Search
USPC .................................. 438/124, 157, 268, 200
See application file for complete search history.

(56) References Cited

U.S. PATENT DOCUMENTS 6,118,161 A * 9/2000 Chapman et al. ............. 257/401
6,713,323 B2 3/2004 Yamazaki et al.
(Continued)

FOREIGN PATENT DOCUMENTS

EP         A1727194 A1    11/2006
JP         2003229575 A    8/2003
(Continued)

OTHER PUBLICATIONS

Kaneko et al., Sidewall transfer process and selective gate sidewall spacer formation technology for sub-15nnn finfet with elevated source/drain extension, IEDM Technical Digest, pgs. 844-847 (Dec. 2005).
(Continued)

*Primary Examiner* — David Vu
*Assistant Examiner* — Jonathan Han
(74) *Attorney, Agent, or Firm* — Vazken Alexanian; Michael J. Chang, LLC

(57) ABSTRACT

Improved fin field effect transistor (FinFET) devices and methods for the fabrication thereof are provided. In one aspect, a field effect transistor device is provided. The field effect transistor device includes a source region; a drain region; a plurality of fins connecting the source region and the drain region, the fins having a pitch of between about 40 nanometers and about 200 nanometers and each fin having a width of between about ten nanometers and about 40 nanometers; and a gate stack over at least a portion of the fins, wherein the source region and the drain region are self-aligned with the gate stack.

10 Claims, 28 Drawing Sheets

(56) References Cited

U.S. PATENT DOCUMENTS

| | | |
|---|---|---|
| 6,764,884 B1 | 7/2004 | Yu et al. |
| 6,911,383 B2 | 6/2005 | Doris et al. |
| 6,949,768 B1 * | 9/2005 | Anderson et al. ............ 257/411 |
| 6,960,509 B1 | 11/2005 | Han et al. |
| 7,074,662 B2 | 7/2006 | Lee et al. |
| 7,094,650 B2 | 8/2006 | Chaudhary et al. |
| 7,129,550 B2 | 10/2006 | Fujiwara et al. |
| 7,183,152 B1 | 2/2007 | Dakshina-Murthy et al. |
| 7,186,599 B2 | 3/2007 | Ahmed et al. |
| 2002/0177263 A1 | 11/2002 | Hanafi et al. |
| 2004/0197975 A1 | 10/2004 | Krivokapic et al. |
| 2005/0019993 A1 | 1/2005 | Lee et al. |
| 2005/0020015 A1 | 1/2005 | Mathew et al. |
| 2005/0020020 A1 | 1/2005 | Collaert et al. |
| 2005/0026377 A1 * | 2/2005 | Kawasaki et al. ............ 438/301 |
| 2005/0051825 A1 | 3/2005 | Fujiwara et al. |
| 2005/0059194 A1 | 3/2005 | Lee et al. |
| 2005/0121412 A1 | 6/2005 | Beintner et al. |
| 2005/0199950 A1 * | 9/2005 | Chau et al. .................... 257/328 |
| 2005/0202608 A1 | 9/2005 | Beintner |
| 2006/0006446 A1 | 1/2006 | Schwerin |
| 2006/0166456 A1 | 7/2006 | Fujiwara et al. |
| 2006/0189043 A1 * | 8/2006 | Schulz ........................... 438/142 |
| 2006/0249784 A1 | 11/2006 | Black et al. |

FOREIGN PATENT DOCUMENTS

| | | |
|---|---|---|
| JP | 2005086024 A | 3/2005 |
| JP | 2005268782 A | 9/2005 |
| JP | 2006522486 A | 9/2006 |
| WO | WO2005020312 A1 | 3/2005 |

OTHER PUBLICATIONS

Kavalieros et al., Tri-Gate Transistor Architecture with High-k Gate Dielectrics, Metal Gates and Strain Engineering, Symposium on VLSI Technology 2006, pp. 50-51 (Jun. 2006).

Shang et al., Investigation of FinFET Devices for 32nm Technologies and Beyond, Symposium on VLSI Technology 2006, pp. 54-55 (Jun. 2006).

Woo et al., 30 nm self-aligned FinFET with large source/drain fan-out structure, Electronics Letters, vol. 39, No. 15, pp. 1154-1155 (Jul. 24, 2003).

Choi et al., A Spacer Patterning Technology for Nanoscale CMOS, IEEE Trans. Elec. Dev., vol. 49, No. 3, pp. 436-441 (Mar. 2002).

F. Cornu-Fruleux et al., Spacer-First Damascene-Gate FinFET Architecture Featuring Stringer-Free Integration, IEEE Electron Device Letters, vol. 28, No. 6, pp. 523-526 (Jun. 2007).

Huang et al., "Sub-50 nm P-Channel FinFet" IEEE Transactions on Electron Devices, IEEE Service Center, Piscataway, NJ, US, vol. 48, No. 5, May 2001.

St. Trellenkamp, J. Moers, A. van der Hart, P. Kordo and H. Luth, Patterning of 25-nm-wide silicon webs with an aspect ratio of 13, Apr. 5, 2003. Elsevier Science B.V., Microelectronic Engineering, pp. 376-380.

English Abstract of JP2005086024A, filed by Fujiwara Minoru; Toshiba Corp., published Mar. 31, 2005.

English Abstract of JP2003229575A, filed by Hisamoto Masaru; Hitachi Ltd., published Aug. 15, 2003.

* cited by examiner

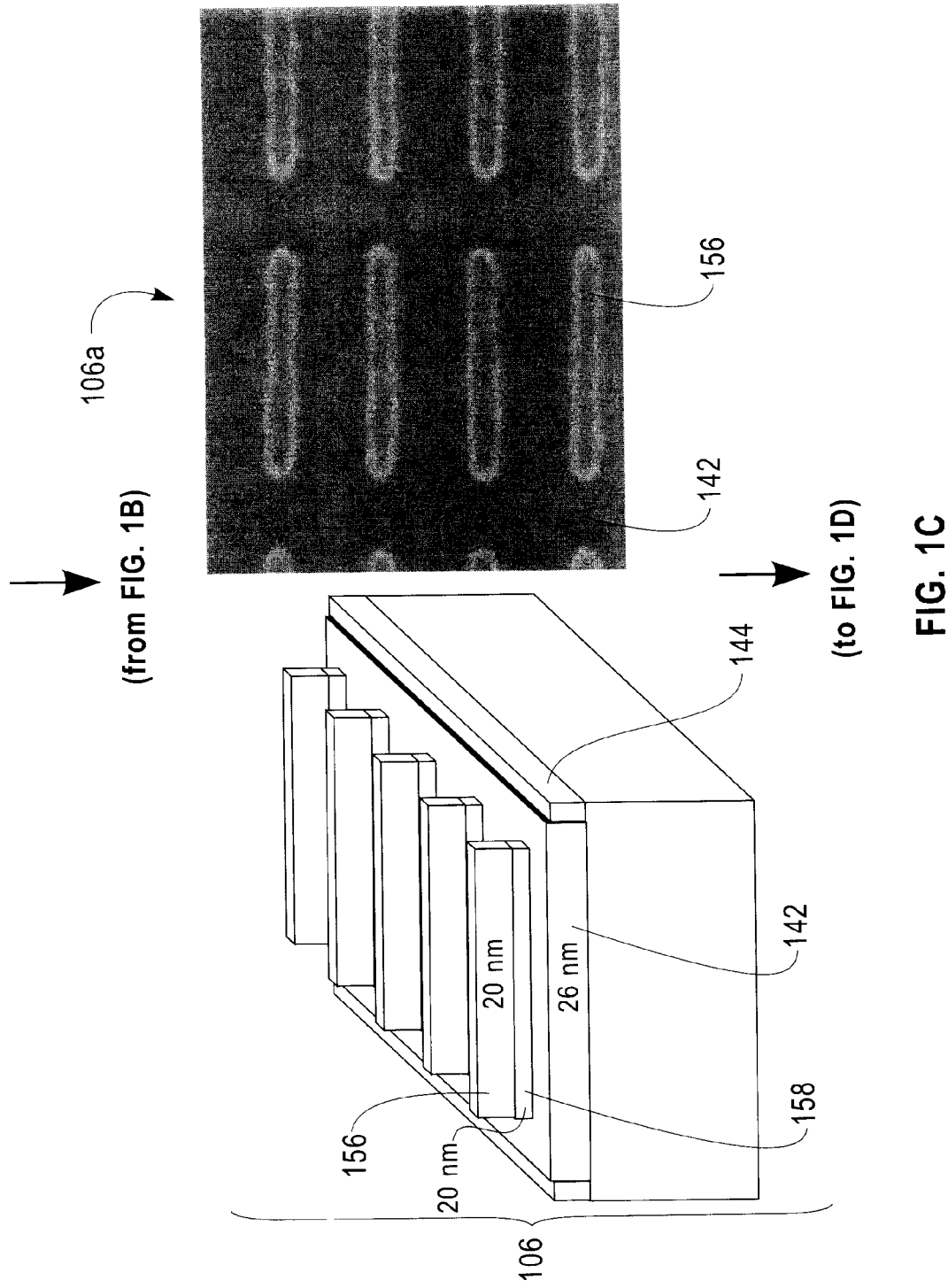

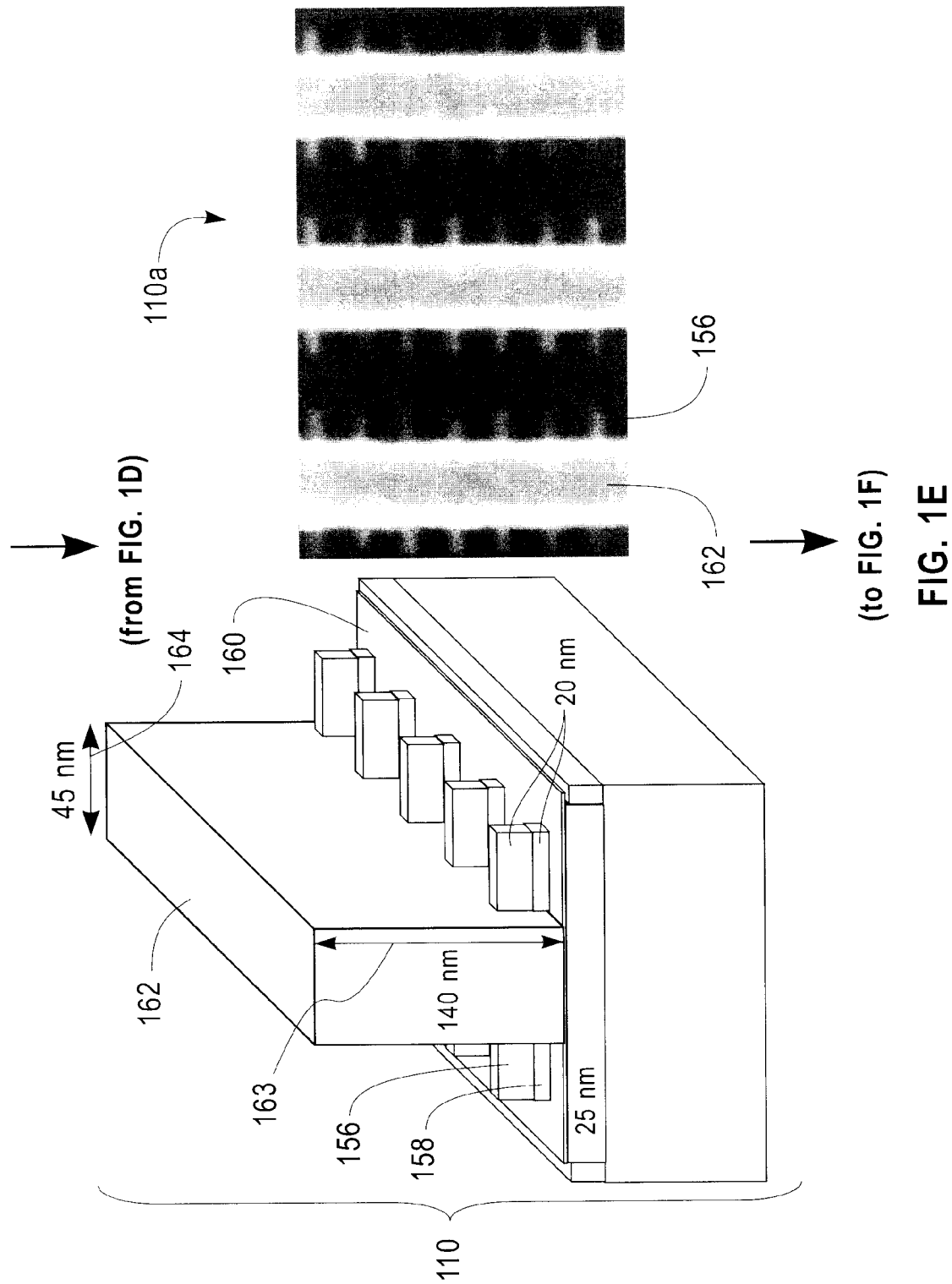

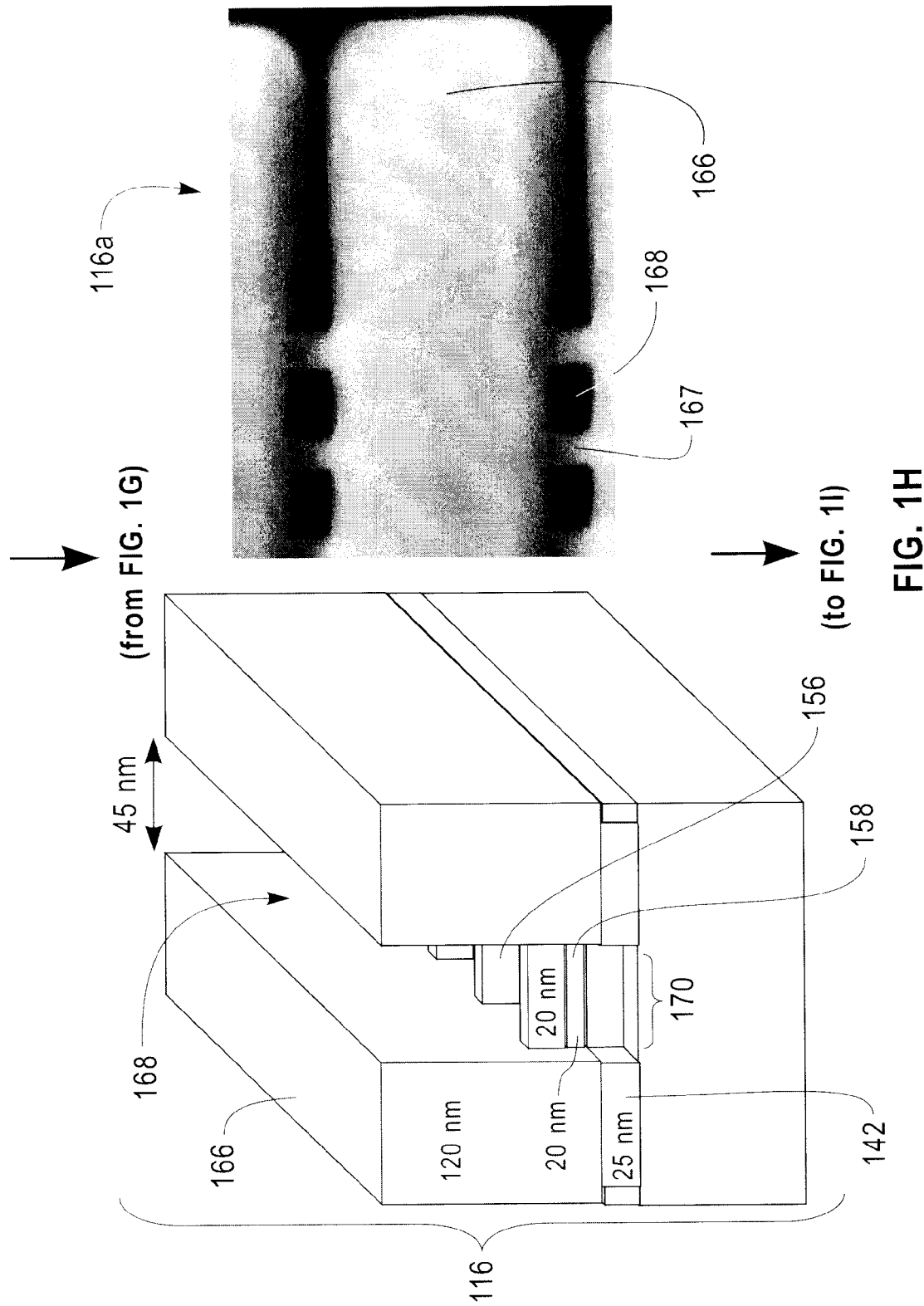

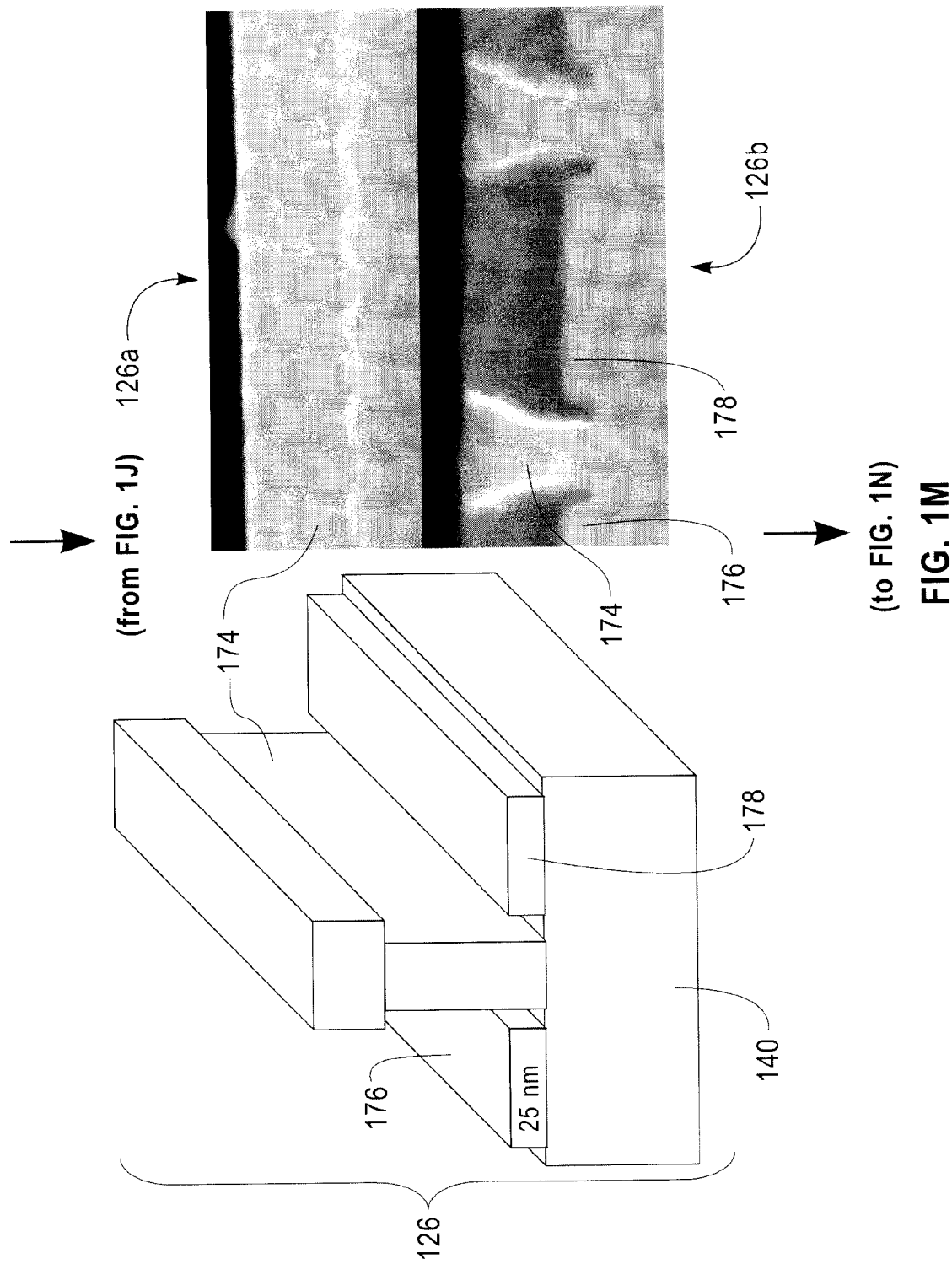

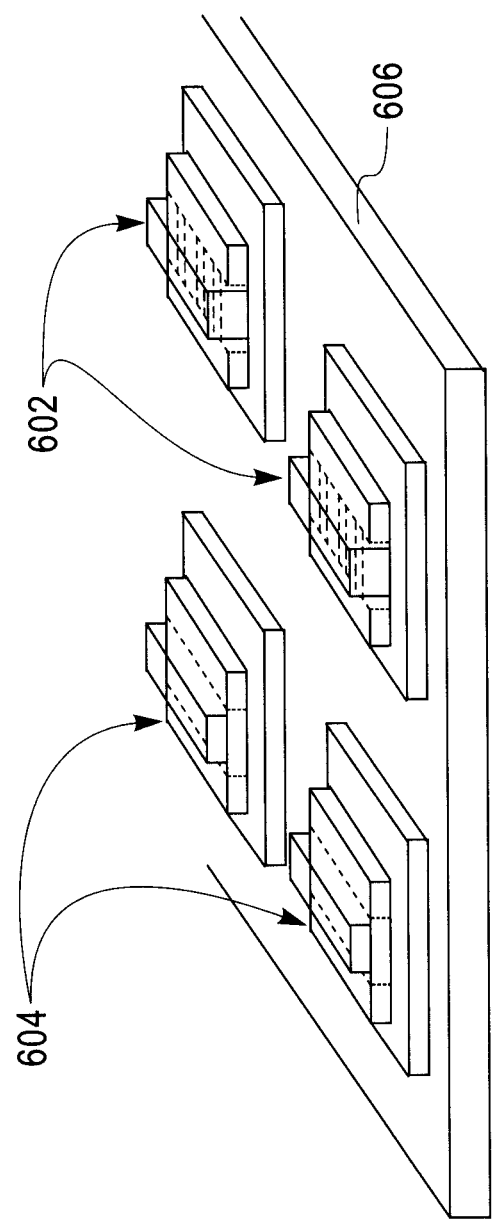

FIN FIELD EFFECT TRANSISTOR DEVICES WITH SELF-ALIGNED SOURCE AND DRAIN REGIONS

CROSS-REFERENCE TO RELATED APPLICATION(S)

This application is a continuation of U.S. application Ser. No. 12/544,939 filed on Aug. 20, 2009, now U.S. Pat. No. 8,592,280, which is a divisional of U.S. application Ser. No. 11/765,931 filed on Jun. 20, 2007, now U.S. Pat. No. 7,923,337, the disclosure of both of which are incorporated by reference herein.

FIELD OF THE INVENTION

The present invention relates to integrated circuits, and more particularly, to fin field effect transistor (FinFET) devices and methods for the fabrication thereof.

BACKGROUND OF THE INVENTION

Due to their fast switching times and high current densities, fin field effect transistor (FinFET) devices are a desired device architecture. In its basic form, a FinFET device includes a source, a drain and one or more fin-shaped channels between the source and the drain. A gate electrode over the fin(s) regulates electron flow between the source and the drain.

The architecture of a FinFET device, however, presents notable fabrication challenges. For example, as feature sizes of the devices get increasingly smaller (commensurate with current technology) accurately and consistently contacting the source and drain becomes a problem. Some previous demonstrations of FinFET devices have been on single fins, isolated devices or devices built at a greatly relaxed pitch. These characteristics allow the problem of contacting the source and drain to be sidestepped.

Source/drain landing pads are sometimes used to contact the fins, which provides mechanical stability during processing, simplifies the device contacting scheme and reduces external resistance. However, the landing pads have to be precisely aligned with the gate in order to achieve a practical gate pitch (in the case of logic layouts using minimum gate pitch) and to minimize variations in extrinsic resistance and parasitic capacitance. Properly and consistently aligning the landing pads with the gate is difficult. As a result, alternate contacting schemes that do not use landing pads have been proposed. Without landing pads however, contact has to be made with individual fins, which can be difficult, e.g., due to mismatches between minimum fin pitch and minimum pitch for contact vias.

Solutions such as epitaxially merged fins or use of contact bars to contact multiple fins have also been proposed. For example, epitaxial raised source and drain regions have been proposed to reduce series resistance and simplify the contacting scheme. See, for example, Kaneko et al., *Sidewall transfer process and selective gate sidewall spacer formation technology for sub-15 nm finfet with elevated source/drain extension*, IEDM Technical Digest, pgs. 844-847 (2005), Kavalieros et al., *Tri-Gate Transistor Architecture with High-k Gate Dielectrics, Metal Gates and Strain Engineering*, Symposium on VLSI Technology 2006, pgs. 50-51 (2006) and Shang et al., *Investigation of FinFET Devices for 32 nm Technologies and Beyond*, Symposium on VLSI Technology 2006, pgs. 54-55 (2006).

Epitaxial processes, however, have drawbacks due to their extreme sensitivity to surface chemistry, crystal orientation and growth conditions. For example, with an epitaxial growth process, parasitic growth on the gate has to be prevented, the rest of the device structure has to be protected from aggressive pre-epitaxial cleans and the faceting and direction of epitaxial growth has to be controlled to minimize both parasitic capacitance and resistance and to achieve similar growth on differently doped source and drain surfaces.

U.S. Patent Application No. 2006/0189043 filed by Schulz (hereinafter "Schulz") describes a finFET device fabrication method involving use of a mask layer over a substrate, creating a trench in the mask layer, forming fins in the substrate within the trench and then forming a planarized gate electrode in the trench over the fins. The teachings of Schulz, however, do not provide for formation of fins with the precision and consistency needed for manufacture, especially in the context of scaled process technology.

Therefore, FinFET devices and methods for fabrication thereof that improve the device contacting scheme and scalability of the devices would be desirable.

SUMMARY OF THE INVENTION

The present invention provides improved fin field effect transistor (FinFET) devices and methods for the fabrication thereof. In one aspect of the invention, a method for fabricating a field effect transistor device is provided. The method comprises the following steps. A substrate is provided having a silicon layer thereon. A fin lithography hardmask is patterned on the silicon layer. A dummy gate structure is placed over a central portion of the fin lithography hardmask. A filler layer is deposited around the dummy gate structure. The dummy gate structure is removed to reveal a trench in the filler layer, centered over the central portion of the fin lithography hardmask, that distinguishes a fin region of the device from source and drain regions of the device. The fin lithography hardmask in the fin region is used to etch a plurality of fins in the silicon layer. The trench is filled with a gate material to form a gate stack over the fins. The filler layer is removed to reveal the source and drain regions of the device, wherein the source and drain regions are intact and self-aligned with the gate stack.

In another aspect of the invention, a field effect transistor device is provided. The field effect transistor device comprises a source region; a drain region; a plurality of fins connecting the source region and the drain region, the fins having a pitch of between about 40 nanometers and about 200 nanometers and each fin having a width of between about ten nanometers and about 40 nanometers; and a gate stack over at least a portion of the fins, wherein the source region and the drain region are self-aligned with the gate stack.

In yet another aspect of the invention, a semiconductor device is provided. The semiconductor device comprises a chip having plurality of field effect transistor devices thereon, wherein the plurality of field effect transistor devices include at least one planar field effect transistor and at least one fin field effect transistor, wherein the at least one fin field effect transistor comprises: a source region; a drain region; a plurality of fins connecting the source region and the drain region, the fins having a pitch of between about 40 nanometers and about 200 nanometers and each fin having a width of between about ten nanometers and about 40 nanometers; and a gate stack over at least a portion of the fins, wherein the source region and the drain region are self-aligned with the gate stack.

A more complete understanding of the present invention, as well as further features and advantages of the present invention, will be obtained by reference to the following detailed description and drawings.

BRIEF DESCRIPTION OF THE DRAWINGS

FIG. 6 is a diagram illustrating FinFET and planar FET devices integrated on a single chip according to an embodiment of the present invention;

DETAILED DESCRIPTION OF PREFERRED EMBODIMENTS

Figure 1A:
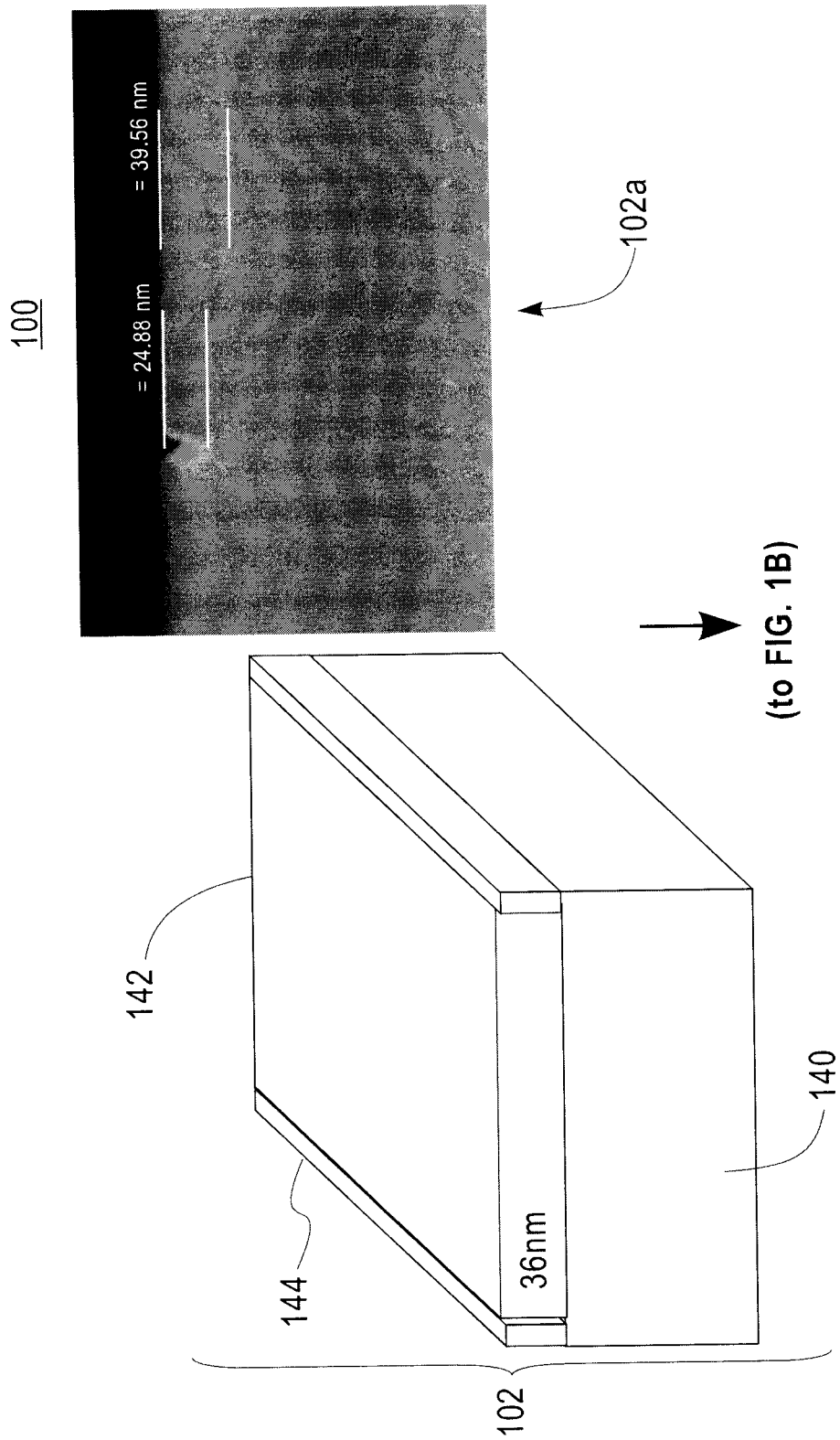
FIGS. 1A-O are diagrams illustrating an exemplary methodology for fabricating a fin field effect transistor (FinFET) device according to an embodiment of the present invention.
Figure 1B:
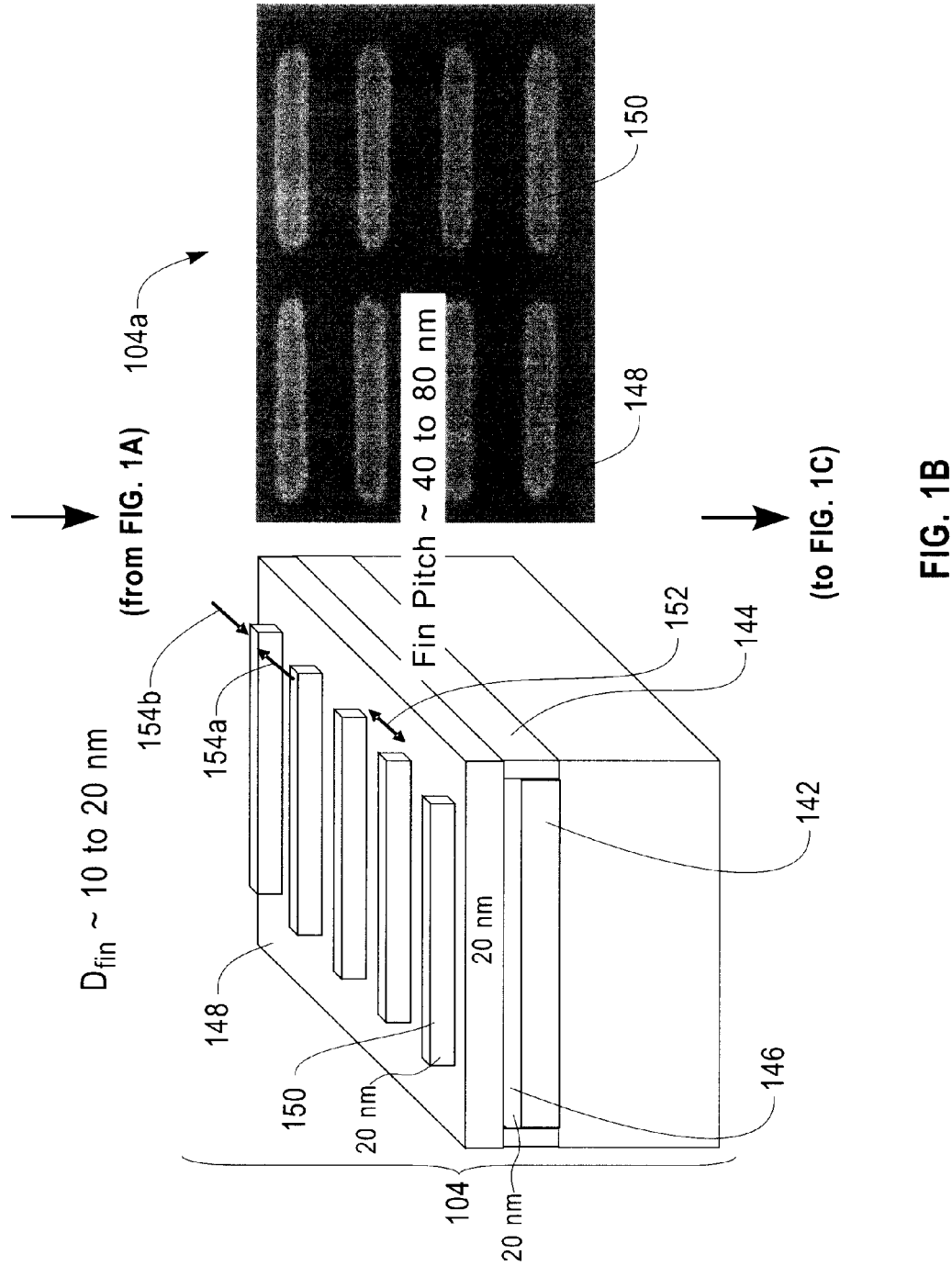
Figure 1D:
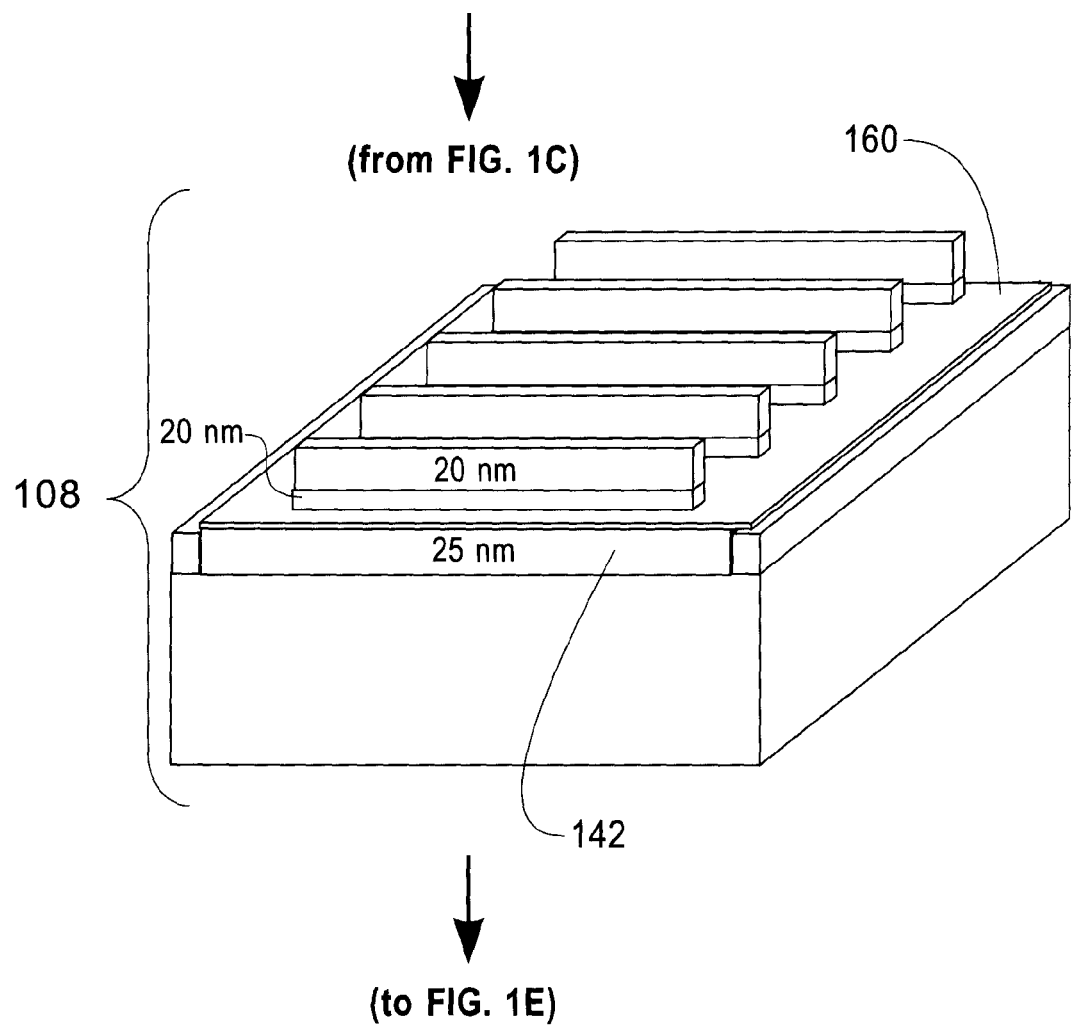
Figure 1F:
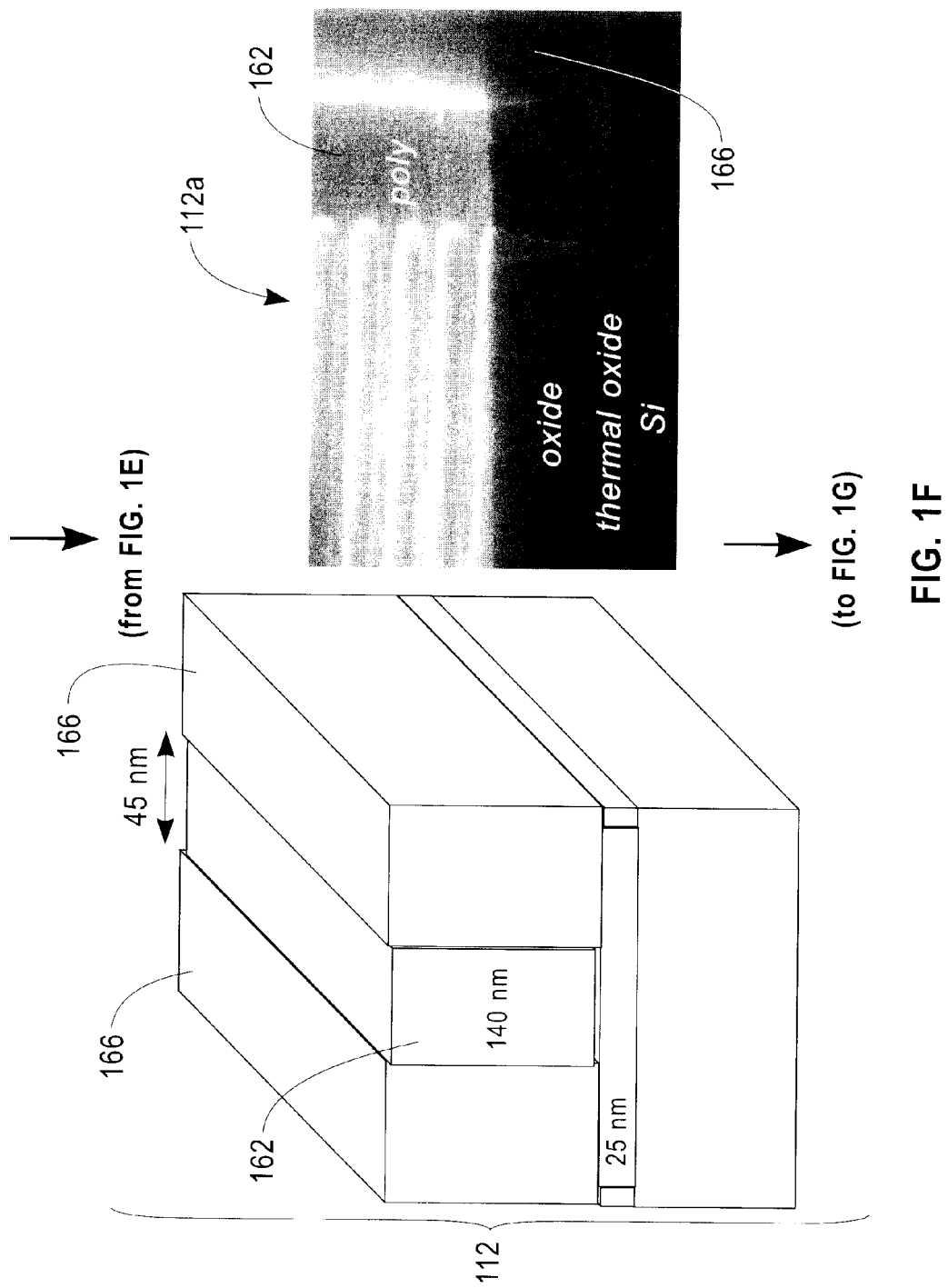
Figure 1G:
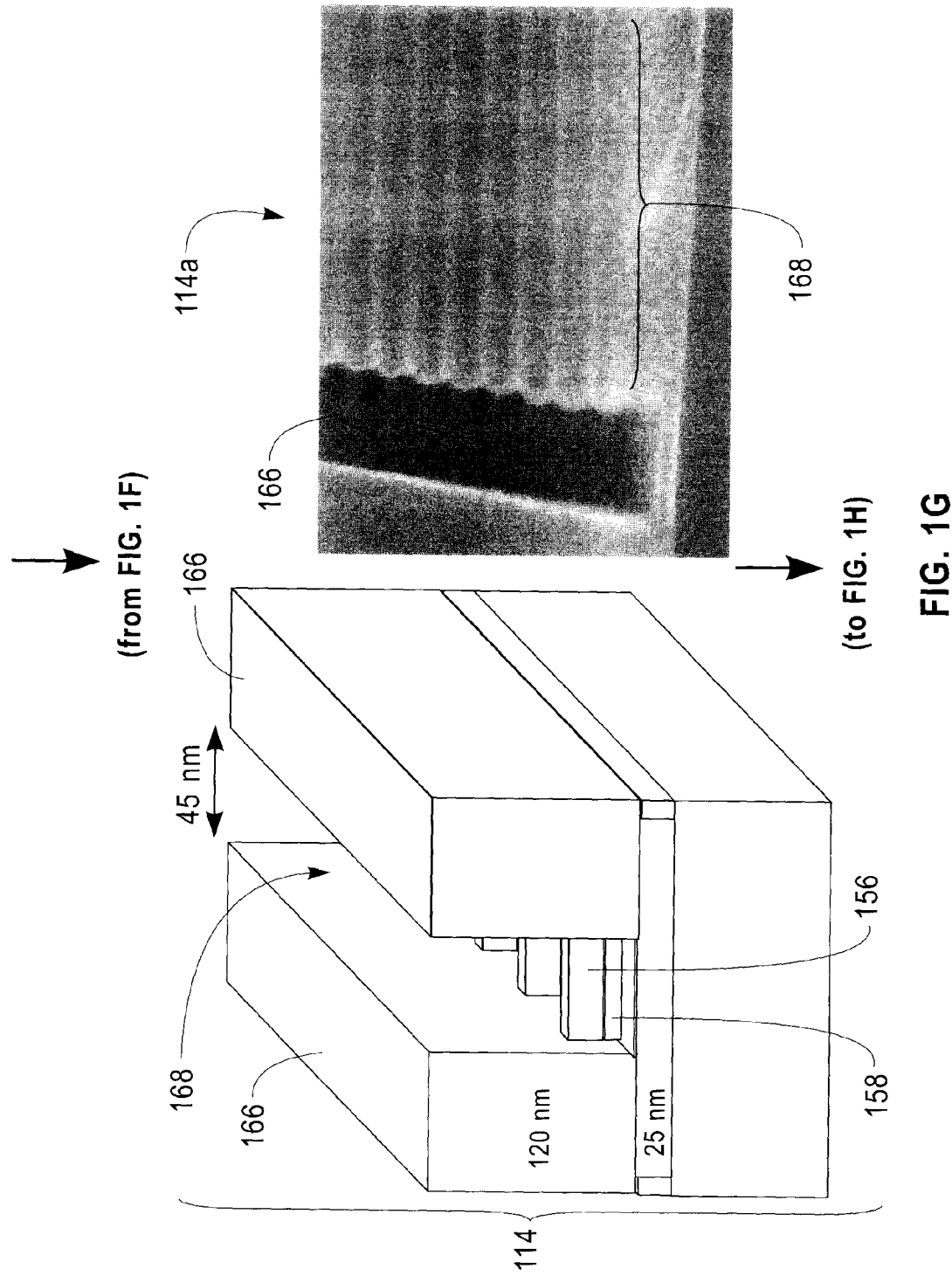
Figure 1I:
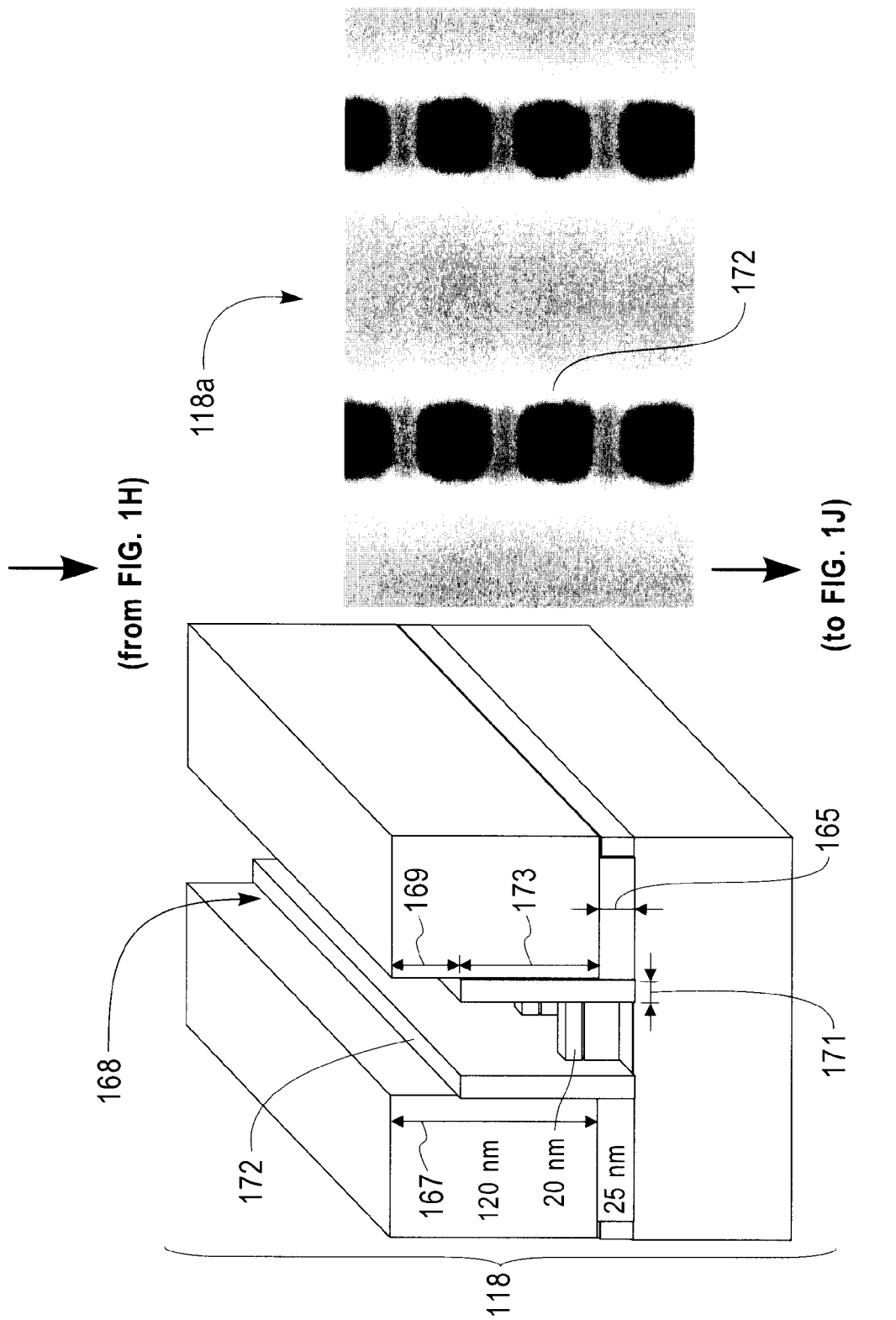
Figure 1J:
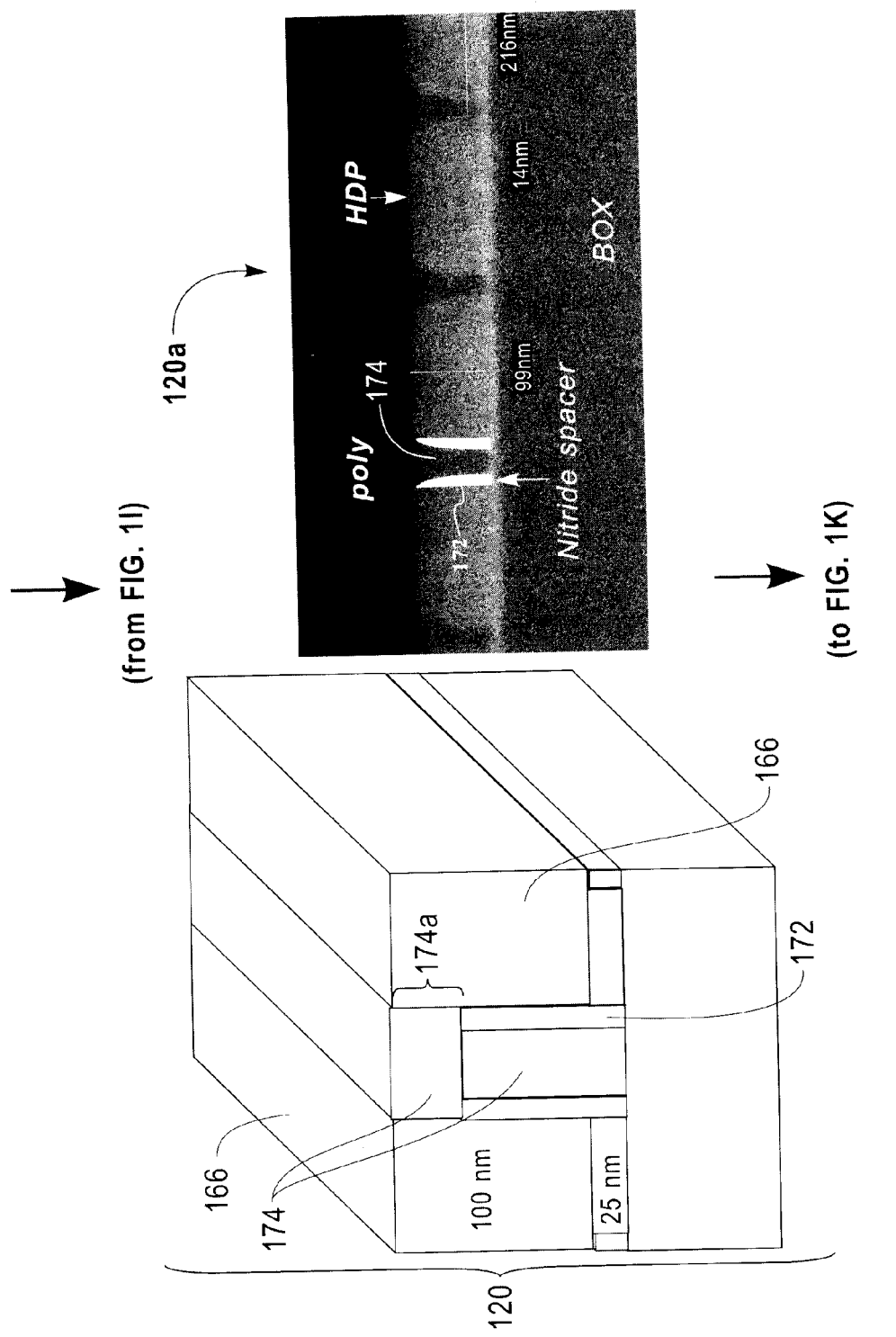
Figure 1K:
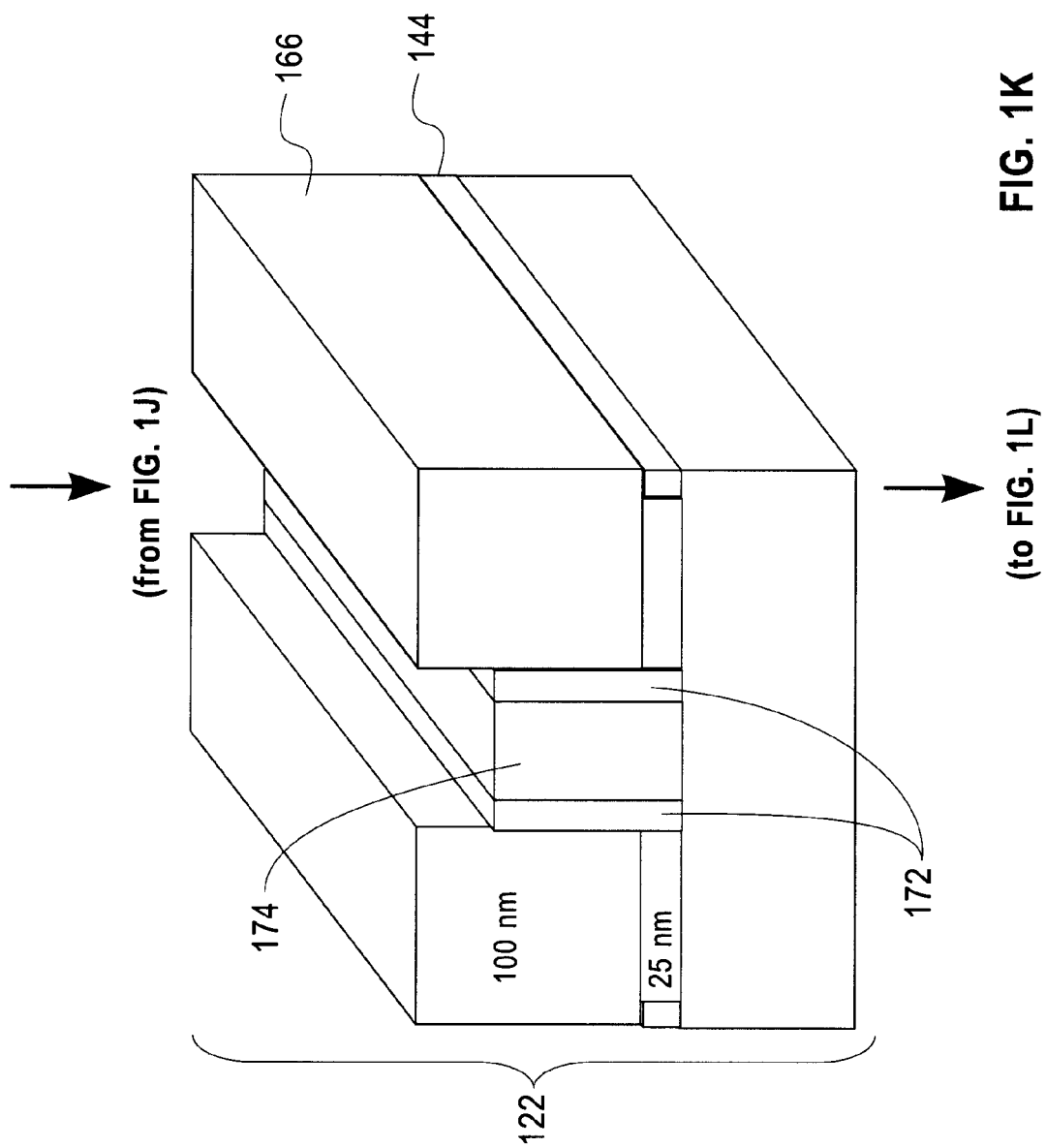
Figure 1L:
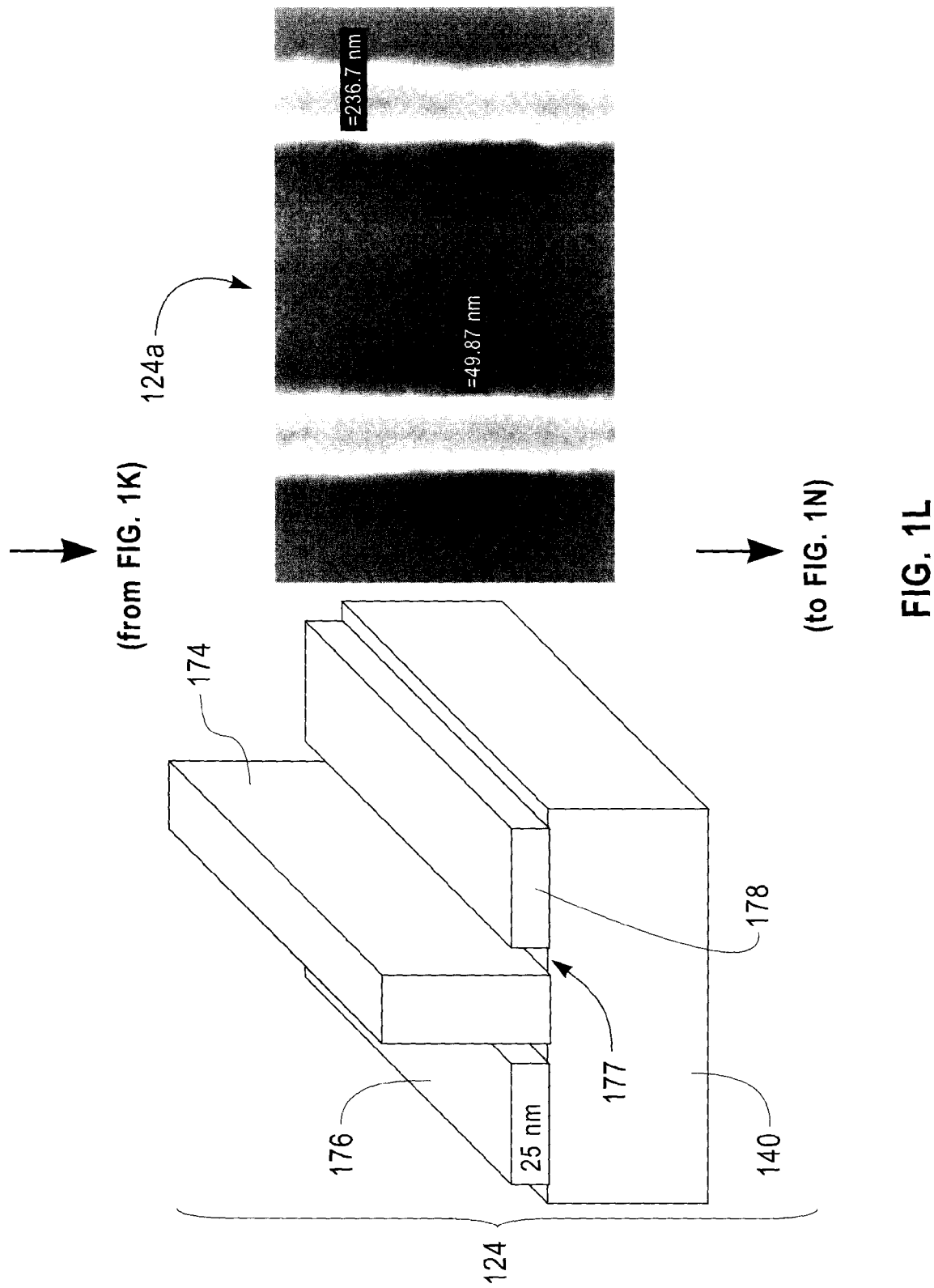
Figure 1N:
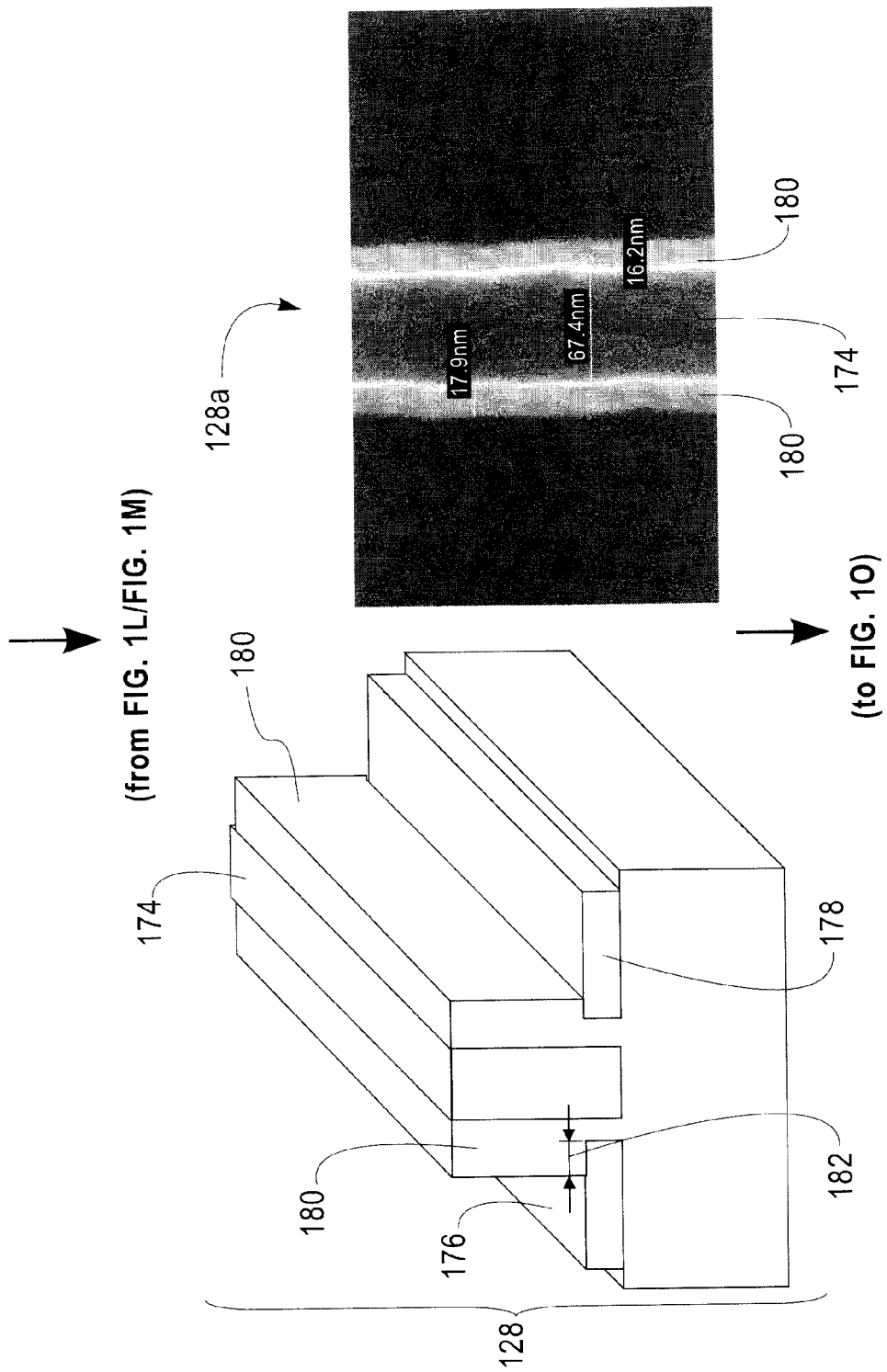
Figure 1O:
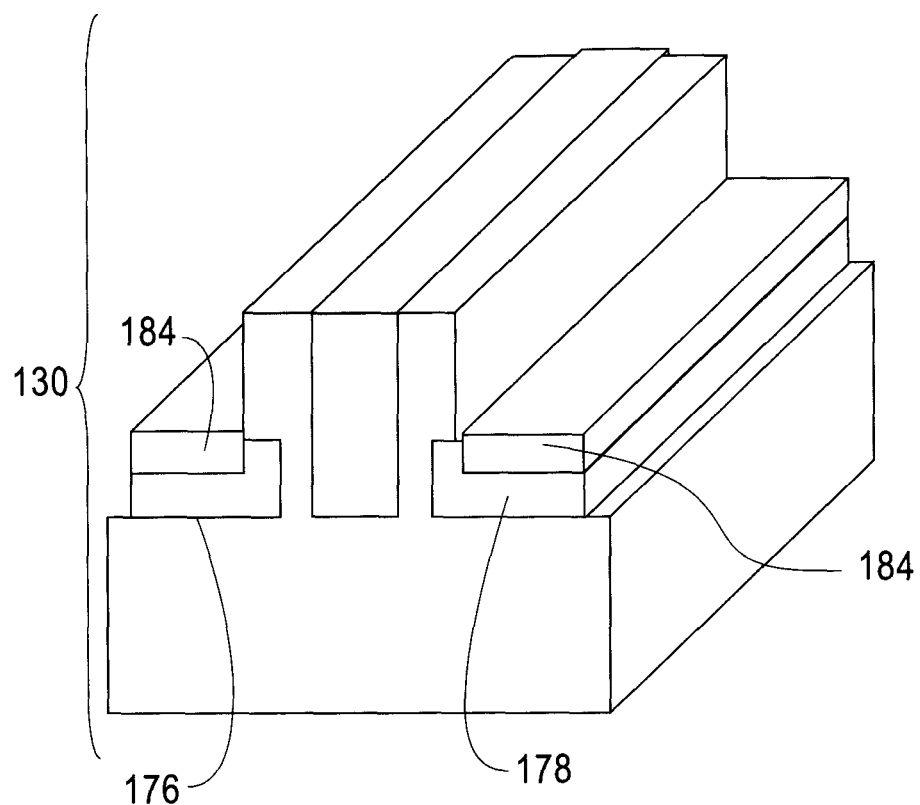

FIGS. 1A-O are diagrams illustrating exemplary methodology 100 for fabricating a fin field effect transistor (FinFET) device. As will be described in detail below, the present techniques make use of a damascene gate process to construct source/drain regions that are self-aligned with the gate. In step 102, shallow trench isolation (STI) is used to define a silicon active area in a silicon-on-insulator (SOI) substrate. Namely, a substrate, i.e., substrate 140, is provided. The substrate can comprise any suitable insulator material including, but not limited to, dielectric materials, such as silicon dioxide ($SiO_2$). According to an exemplary embodiment, substrate 140 has a nitride layer, i.e., nitride layer 144, thereon. A trench is etched in nitride layer 144 and silicon is deposited in the trench to form silicon layer 142. Excess silicon can be removed from silicon layer 142 using a planarization technique, such as chemical-mechanical planarization (CMP). According to an exemplary embodiment, silicon layer 142 is configured to have a thickness of between about 30 nanometers (nm) to about 40 nm, e.g., about 36 nm. Scanning electron microscopy (SEM) image 102a illustrates a top-down view of the STI formation of the silicon active area on substrate 140. Substrate 140 may also be referred to herein as a buried oxide (BOX) layer.

STI is generally employed with process technology in the nm feature size range. As will be described in detail below, the present techniques are suitable for producing FinFET devices with gate lengths down to below 30 nm, e.g., gate lengths down to about 22 nm.

Alternatively, the FinFET device presented herein can be fabricated using a bulk silicon substrate, rather than an SOI substrate. In that instance, deep well implants can be used to achieve isolation in the bulk silicon substrate.

Prior to the damascene gate process, a fin lithography hardmask is fabricated. In step 104, oxide layer 146 is formed on silicon layer 142. According to an exemplary embodiment, oxide layer 146 comprises $SiO_2$, and is formed using thermal oxidation. Namely, an oxidizing agent, such as oxygen, is diffused into silicon layer 142 at a temperature of between about 700 degrees Celsius (° C.) and about 1,100° C. to grow oxide layer 146. As a result of the oxidation process, a portion of silicon layer 142 is consumed, reducing the thickness of silicon layer 142 to between about 20 nm and about 30 nm, e.g., to about 26 nm. Oxide layer 146 can have a thickness of between about 15 nm and about 25 nm, e.g., about 20 nm.

A second nitride layer, i.e., nitride layer 148, is deposited over nitride layer 144/oxide layer 146. According to an exemplary embodiment, nitride layer 148 is deposited using low-pressure chemical vapor deposition (LPCVD) to a thickness of between about 15 nm and about 20 nm, e.g., about 20 nm. Thus, nitride layer 148 can have a same thickness as oxide layer 146.

A resist film having a thickness of between about 15 nm and about 25 nm, e.g., about 20 nm, is deposited on nitride layer 148, masked and then patterned into fin resist stacks 150. According to an exemplary embodiment, reactive ion etching (RIE) will be used to form fin hardmasks, e.g., in nitride layer 148 (see description of step 106, below). Thus the resist film used to form fin resist stacks 150 should comprise a suitable resist material stack such as hydrogen silsesquioxane (HSQ) patterned using electron beam (e-beam) lithography and transferred to a carbon-based resist.

The positioning of fin resist stacks 150 will ultimately determine the positioning of the fins in the completed FinFET device. According to an exemplary embodiment, fin resist stacks 150 are configured to have a pitch, i.e., a distance between each adjacent fin resist stack, (as indicated by arrow 152) of between about 40 nm and about 200 nm, e.g., between about 40 nm and about 80 nm, and a width $D_{fin}$ (as indicated by arrows 154a and 154b) of between about ten nm and about 40 nm, e.g., between about ten nm and about 20 nm. As such, the resulting fins will also have a pitch, i.e., a distance between adjacent fins, of between about 40 nm and about 200 nm, e.g., between about 40 nm and about 80 nm, and a width of between about ten nm and about 40 nm, e.g., between about ten nm and about 20 nm. Fin height dimensions will be described, for example, in conjunction with the description of FIG. 5, below. SEM image 104a illustrates a top-down view of fin resist stacks 150 on nitride layer 148.

A hardmask open stage, which is performed using a series of RIE steps, is shown in step 106. According to an exemplary embodiment, a nitride-selective RIE using fin resist stacks 150 (not shown) as a mask is first used to remove all but the portions of nitride layer 148 beneath fin resist stacks 150, forming fin hardmask layer 156. Oxide layer 146 acts as an etch stop for the nitride-selective RIE. The nitride-selective RIE can also at the same time etch nitride layer 144, with silicon layer 142 acting as an etch stop (as shown in step 106). As a result, nitride layer 144 will also then have a thickness of between about 20 nm and about 30 nm, e.g., about 26 nm.

Next, using fin hardmask layer 156 as a mask, an oxide-selective RIE is used to remove all but the portions of oxide layer 146 beneath fin hardmask layer 156, forming fin hardmask layer 158. Silicon layer 142 acts as an etch stop for the oxide-selective RIE. As with nitride layer 148 and oxide layer 146, fin hardmask layers 156 and 158, respectively, each have thicknesses of between about 15 nm and about 20 nm, e.g., about 20 nm.

Fin hardmask layers 156 and 158 form a dual fin hardmask structure. SEM image 106a illustrates a top-down view of the dual fin hardmask structure on silicon layer 142. The use of a dual fin hardmask structure permits more precise and uniform fins to be formed in the silicon layer (see fin formation step 116, described below). Namely, with the dual fin hardmask structure, fin hardmask layer 156 (nitride layer) protects the integrity of fin hardmask layer 158 (oxide layer) during dummy gate definition (see step 110, described below), and fin hardmask layer 158 (oxide layer) protects the fins during spacer (nitride-selective) etch (see step 118, described below). Maintaining good integrity of the fin hardmasks is important for minimizing variations in fin height and width. Variations in fin height are described, for example, in conjunction with the description of FIG. 5, below. As FinFET device sizes become increasingly smaller, the effect of unwanted variations in fin dimensions, such as variations in fin thickness, become even more pronounced. Variations in fin dimensions are undesirable as they can affect the device threshold.

In step 108, an oxide stopping layer, i.e., oxide layer 160, is formed on silicon layer 142. According to an exemplary embodiment, thermal oxidation is used to grow oxide layer 160 to a thickness of up to about four nm, e.g., up to about two nm. As described above, a portion of silicon layer 142 is consumed during thermal oxidation processes. Thus, the thickness of silicon layer 142 is reduced further to between about 25 nm and about 26 nm.

In step 110, to begin the damascene gate process, a dummy gate structure 162 is formed. The dummy gate structure comprises polycrystalline silicon (polysilicon). According to an exemplary embodiment, dummy gate structure 162 is formed by first depositing a polysilicon layer over oxide layer 160/fin hardmask layers 156 and 158 using LPCVD to a thickness of between about 100 nm and about 150 nm, e.g., about 140 nm. Since the thickness of the polysilicon layer will determine a height of the dummy gate, CMP may be used after deposition to achieve the desired thickness/height. Resist is then deposited on the polysilicon layer, masked and patterned with the dummy gate footprint. Polysilicon-selective RIE is then used to remove all but a central portion of the polysilicon layer located centrally over fin hardmask layers 156 and 158, which is dummy gate 162. According to an exemplary embodiment, dummy gate 162 has a height 163 of between about 100 nm and about 150 nm, e.g., about 140 nm, and a length 164 of between about 30 nm and about 50 nm, e.g., about 45 nm. SEM image 110a illustrates a top-down view of dummy gate 162 located centrally over the dual fin hardmask structure.

In step 112, filler layer 166, is deposited around dummy gate 162. Filler layer 166 can comprise any suitable filler material, including a dielectric, such as $SiO_2$. According to an exemplary embodiment, filler layer 166 is deposited around dummy gate 162 using a high-density plasma (HDP). CMP is then used to planarize the filler material, using the dummy gate as an etch stop. Thus, filler layer 166 will have a thickness equivalent to the height of the dummy gate, e.g., between about 100 nm and about 150 nm, e.g., about 140 nm. SEM image 112a illustrates a cross-sectional view of filler layer 166 and dummy gate 162.

In step 114, dummy gate 162 is removed forming gate trench 168 in filler layer 166. Since trench 168 is a negative pattern of dummy gate 162, trench 168 is also located centrally over fin hardmask layers 156 and 158. SEM image 114a illustrates a top-down view of trench 168. According to an exemplary embodiment, trench 168 distinguishes a fin region of the FinFET device from source and drain regions of the device.

Dummy gate 162 can be removed using wet chemical etching or dry etching. According to an exemplary embodiment, a wet chemical etch is used to remove dummy gate 162. The etching may also have an effect on the filler layer, removing a portion thereof. For example, after the etch process to remove dummy gate 162, filler layer 166 can be reduced to a thickness of between about 115 nm and about 125 nm, e.g., about 120 nm.

The use of a dummy gate is an important aspect of the present techniques. Namely, the dummy gate allows for the fin hardmask layers to be placed prior to forming the filler layer, such that when the dummy gate is removed, the fin hardmask layers revealed are already present within the trench. The fin hardmask layers are important for more precise and uniform fins to be formed in the fin region. Patterning well-defined fins with straight sidewalls inside the trench without the fin hardmask layers already present would be extremely difficult, if at all possible, due to the topography within the trench. As described above, minimizing variations in fin dimensions is desirable as variations can change the device threshold.

In step 116, fins are formed in silicon layer 142. Namely, a silicon-selective RIE is used to remove portions, i.e., portions 170, of silicon layer 142 in trench 168 not masked by the dual fin hardmask structure. Substrate 140 acts as an etch stop. SEM image 116a illustrates a top-down view of fin/dual fin hardmask structures 167 etched in trench 168. As is shown in image 116a, the fin/dual fin hardmask structures have sharp, well-defined edges. As described above, this is a result of using a dual hardmask structure to pattern the fins.

An advantage of the present teachings is that the fins are etched only within trench 168, leaving the source/drain regions of the device intact below filler layer 166. Further, the source/drain regions produced in this manner will be self-aligned with trench 168 and thus with a device gate that will be formed in trench 168 (step 120, described below).

As described above, the present techniques can be used to form fins having a pitch, i.e., a distance between adjacent fins, of between about 40 nm and about 200 nm, e.g., between about 40 nm and about 80 nm, and a width of between about ten nm and about 40 nm, e.g., between about ten nm and about 20 nm. Further, each of the fins can have a height of between about 20 nm and about 100 nm, e.g., about 25 nm. Fin height is described, for example, in conjunction with the description of FIG. 5, below.

In step 118, spacers 172 are formed in trench 168. This step is optional. Placing spacers between what will be the source/drain regions of the device and the device gate (that will be formed in trench 168, see step 120) will help to minimize parasitic capacitance in the completed device, but is not necessary for preventing gate-to-source/drain shorting during raised source/drain (RSD) epitaxial growth or silicide, i.e., as in typical FinFET flows. Spacers 172, which will be removed and replaced with an oxide spacer in the completed device, serve primarily at this stage to offset the gate a certain distance from the source/drain regions.

According to an exemplary embodiment, spacers 172 are formed by first depositing a nitride layer into trench 168. A resist film is then deposited on the nitride layer, masked and patterned with the spacer footprints. A nitride-selective RIE is then used to define spacers 172 in the nitride layer. A large timed overetch is needed to clear the sidewalls of the fin/dual fin hardmask structure, such that the spacers are present only along the sidewalls of the trench and not on the fins. The minimum pulldown of spacers 172 is thus the height of the fins and remaining fin hardmask layers. For example, the amount of overetch is between about 50 percent (%) and about 80% of the etch time required to remove the entire nitride layer. During this etch, fin hardmask layer 156 is also removed. The spacers can have a length 171 of between about five nm and about 25 nm. A maximum height of the spacers is equal to height 167 of trench 168 less height 169 of the spacer pulldown, i.e., height 173. A minimum height of the spacers is height 165 of the source/drain regions (see step 124, described below), e.g., about 25 nm. SEM image 118a illustrates a top-down view of trench 168 having spacers 172 therein.

In step 120, a replacement gate, i.e., gate stack 174, is formed over the fins by filling trench 168 with a gate material. Once the gate material is filled into trench 168, CMP is used to planarize the gate with filler layer 166 as an etch stop. Suitable gate materials include, but are not limited to, one or more of polysilicon, a deposited metal(s) and a hybrid stack of multiple materials such as metal polysilicon.

Optionally, any of the fin hardmask layers remaining over the fins can be removed prior to filling the trench with the polysilicon material. Removing the fin hardmask layers, however, is not necessary. Further, according to an exemplary embodiment, prior to filling the trench with the gate material, a thermal oxidation process can be used to grow a sacrificial oxide layer, e.g., $SiO_2$ or oxynitride, in trench 168, or a high-k dielectric material layer can be deposited into trench 168. These thermal oxide or high-k dielectric layers can serve as a gate dielectric between the gate and the fins.

As shown in step 120, gate stack 174 can have a flared top section 174a, which is a result of the varied width of trench 168 by spacers 172. As will be described, for example, in conjunction with the description of step 122, below, this flared top section of the gate stack can optionally be removed. SEM image 120a illustrates a cross-sectional side view of gate stack 174.

In step 122, flared top section 174a is trimmed away from gate stack 174. As described above, this step is optional. For example, the remaining steps of methodology 100 can be performed without removing flared top section 174a from gate stack 174 (see, for example, step 126). Removing the flared top section provides for a more compact layout, for example, allowing contact studs landing on the source/drain regions to be brought closer to the gate without causing shorts to the gate. According to an exemplary embodiment, flared top section 174a is trimmed away using CMP with spacers 172 as an etch stop.

As described above, the same processing steps can be carried out whether flared top section 174a is, or is not, trimmed away from gate stack 174 (steps 124 and 126, respectively). Namely, in both steps 124 and 126, gate stack 174 and substrate 140 are doped, and filler layer 166 is removed (revealing source/drain region 176 and source/drain region 178). Namely, according to an exemplary embodiment, gate stack 174 is first implanted with a doping agent, such as boron (p-type) or phosphorous (n-type). A wet etch is then used to remove filler layer 166. A doping agent, such as boron, phosphorous or arsenic is then implanted into substrate 140 at a tilt angle of up to about seven degrees.

In the case where the flared top section of the gate is trimmed away, an alternate doping scheme may be implemented. Following the removal of filler layer 166, spacers 172 are also removed, exposing fin extension regions 177. SEM 124a illustrates a top-down view of the structure with exposed fin extension regions 177. A doping agent, such as one or more of boron, phosphorous and arsenic is then implanted into substrate 140 at a tilt angle of between about 20 degrees and about 45 degrees.

SEM image 126a illustrates a cross-sectional side view of fin shapes embedded within a gate stack, i.e., gate stack 174. SEM image 126b illustrates a cross-sectional side view of gate stack 174.

In step 128, replacement spacers, i.e., device spacers 180, are added and source/drain regions 176 and 178 are doped. As highlighted above, the use of spacers is optional. See, for example, FIG. 2 wherein a FinFET device without device spacers is presented. Namely, according to an exemplary embodiment, device spacers 180 are formed by first depositing an oxide ($SiO_2$) layer around gate stack 174, including between source/drain regions 176 and 178 and gate stack 174. A resist layer is deposited on the oxide layer, masked and patterned. Oxide selective RIE is then used to form device spacers 180. As shown in step 128, device spacers 180 are preferably configured to extend a distance 182 of between about ten nm and about 40 nm over source/drain regions 176 and 178. SEM image 128a illustrates a top-down view of gate 174 having device spacers 180 on either side thereof.

As highlighted above, the use of spacers 180 is optional, and embodiments are described herein that provide a gap between the source/drain regions and the gate but do not include a spacer in that gap. See, for example, FIGS. 2 and 3A-D, described below.

Source/drain regions 176 and 178 are then doped using top-down deep implants with a doping agent. Suitable doping agents include, but are not limited to boron and phosphorous.

In step 130, silicide regions 184 are formed on source/drain regions 176 and 178. Silicide regions 184 extend into the deep implants of source/drain regions 176 and 178. According to an exemplary embodiment, silicide regions 184 are formed by first depositing a non-transition metal, such as nickel-platinum (NiPt) on source/drain regions 176 and 178, and then annealing to form the silicide. After silicide formation, any standard middle-of-the-line complementary metal-oxide-semiconductor (CMOS) processes, including middle-of-the-line dielectric deposition, contact stud patterning, metal patterning and metallization can be implemented.

Figure 2:
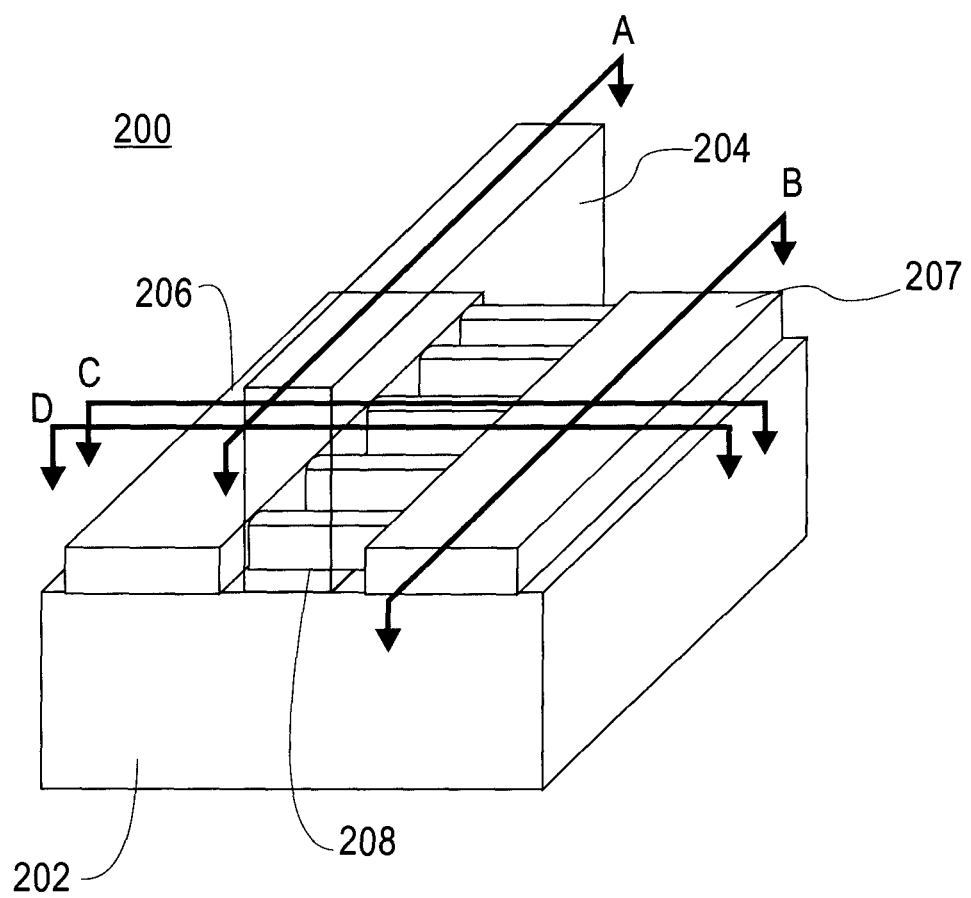
FIG. 2 is a diagram illustrating an exemplary FinFET device with self-aligned source/drain regions according to an embodiment of the present invention.

FIG. 2 is a diagram illustrating exemplary FinFET device 200. FinFET device 200 comprises substrate 202, gate stack 204, source/drain regions 206, source/drain region 207 and fins (channels) 208 between source/drain regions 206 and source/drain region 207. FinFET device 200 is fabricated, for example, according to methodology 100, described in conjunction with the description of FIG. 1, above. Therefore, source/drain regions 206 and 207 are self-aligned with gate stack 204. Cross-sectional views of FinFET device 200 through planes A-D, are shown in FIGS. 3A-D, respectively.

For FinFET devices to be viable in CMOS technology, an important factor is the demonstration of these devices at competitive gate pitch and fin pitch. The general practice in the microelectronics industry has been to use a gate pitch of about 250 nm for a 65 nm technology node and about 190 nm for a 45 nm technology node, with a shrink of between about 70% and about 80% for each subsequent node. Thus, for FinFET devices to be used in a node beyond the 45 nm technology node, a competitive gate pitch would be one that is at most 190 nm.

Fin pitch needs to be at most twice the fin height to achieve equivalency to planar layout density. As described above, a fin pitch of between about 40 nm and about 200 nm, e.g., between about 40 nm and about 80 nm, and a fin height of between about 20 nm and about 100 nm, e.g., about 25 nm, are achievable using the present techniques. In instances where multiple FinFET devices are placed next to each other on the same wafer (FIG. 6) and/or where a number of gate "fingers" control multiple FinFET devices on the same wafer, gate pitch, i.e., distance between gates on adjacent devices, has to be compatible with the current technology node at the time of insertion. A gate pitch of below 200 nm, e.g., between about 180 nm and about 200 nm, is achievable using the present techniques.

Figure 3C:
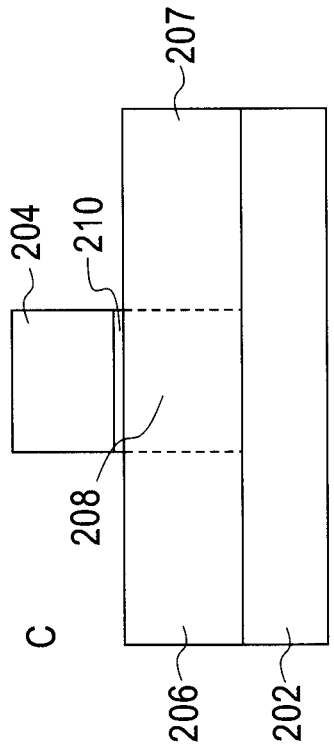
FIGS. 3A-D are diagrams illustrating different cross-sectional views of the FinFET device of FIG. 2 according to an embodiment of the present invention.
Figure 3D:
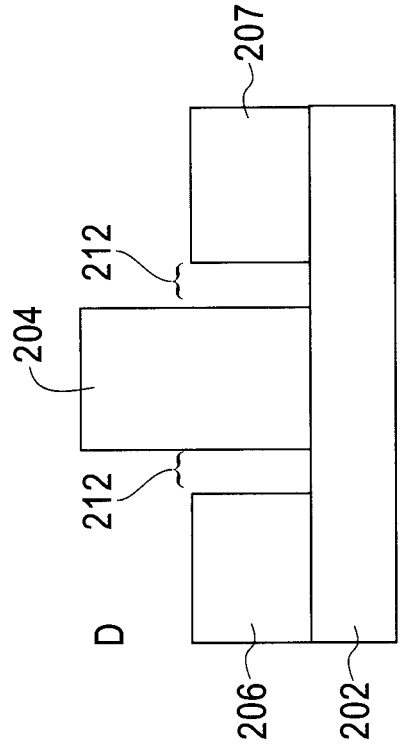
Figure 3A:
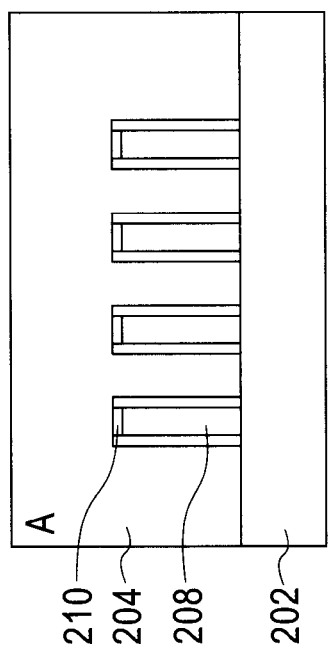

FIGS. 3A-D are diagrams illustrating different cross-sectional views of FinFET device 200, described, for example, in conjunction with the description of FIG. 2, above. Namely, FIG. 3A is a diagram illustrating a cross-sectional view of FinFET device 200 through plane A, which bisects each of the four fins. As shown in FIG. 3A, a gate dielectric 210 is present between gate stack 204 and fins 208.

Figure 3B:
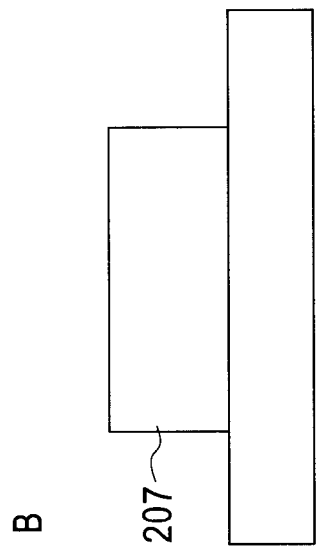

FIG. 3B is a diagram illustrating a cross-sectional view of FinFET device 200 through plane B, which bisects source/drain region 207. FIG. 3C is a diagram illustrating a cross-sectional view of FinFET device 200 through plane C, which bisects gate stack 204 and fins 208/source/drain regions 206 and 207. As shown in FIG. 3C, gate dielectric 210 is present between gate stack 204 and fins 208. For illustrative purposes only, dotted lines are used to distinguish fins 208 from source/drain regions 206 and 207 and to show that, as described above, fins 208 are patterned only beneath gate 204. However, it is to be understood that fins 208 and source/drain regions 206 and 207 form one contiguous structure.

FIG. 3D is a diagram illustrating a cross-sectional view of FinFET device 200 through plane D, which bisects gate stack 204 and source/drain regions 206 and 207. As shown in FIG. 3D, gaps 212 are present between gate stack 204 and source/drain regions 206 and 207. As described above, these gaps may optionally be filled with a device spacer. Further, as will be described in conjunction with the description of FIG. 4, below, the device spacer and the gate dielectric 210 can be configured to achieve a desired differential fringe/gate capacitance in the device.

Figure 4:
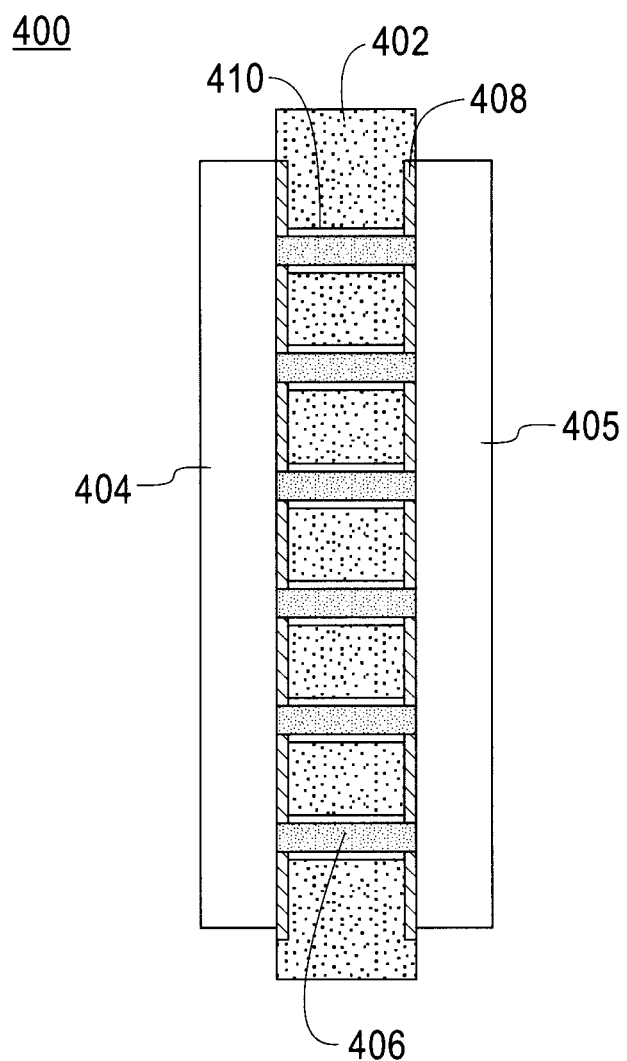
FIG. 4 is a diagram illustrating a top-down view of an exemplary FinFET device showing fringe and gate capacitance according to an embodiment of the present invention.

FIG. 4 is a diagram illustrating a top-down view of exemplary FinFET device 400 showing fringe and gate capacitance. For ease of depiction, only those components necessary for illustrating the fringe and gate capacitance in the device are shown. FinFET device 400 comprises gate stack 402, source/drain region 404, source/drain region 405 and fins 406 between source/drain regions 404 and 405.

The three-dimensional nature of the FinFET device introduces parasitic fringe capacitance between the gate and sidewalls of the source/drain regions (i.e., along sections 408). This fringe capacitance should be kept to a value much smaller than, e.g., less than half, the gate capacitance.

This differential capacitance can be achieved in a number of ways. By way of example only, a spacer can be formed only along regions 408 but not on regions 410. This approach was described in conjunction with the description of step 118 of FIG. 1, above. Differential dielectric growth, in which growth of a dielectric is expedited along the parasitic surfaces, i.e., along sections 408, when compared to the channel surfaces, i.e., along sections 410, during gate dielectric growth, is another way to achieve differential capacitance. Differential dielectric growth may be achieved by taking advantage of the differential oxidation rates of different crystallographic planes and/or by modifying only the parasitic surfaces (source/drain region sidewall surfaces) through tilted implants. Either of these differential dielectric growth approaches can be implemented in place of step 118 of FIG. 1.

Figure 5:
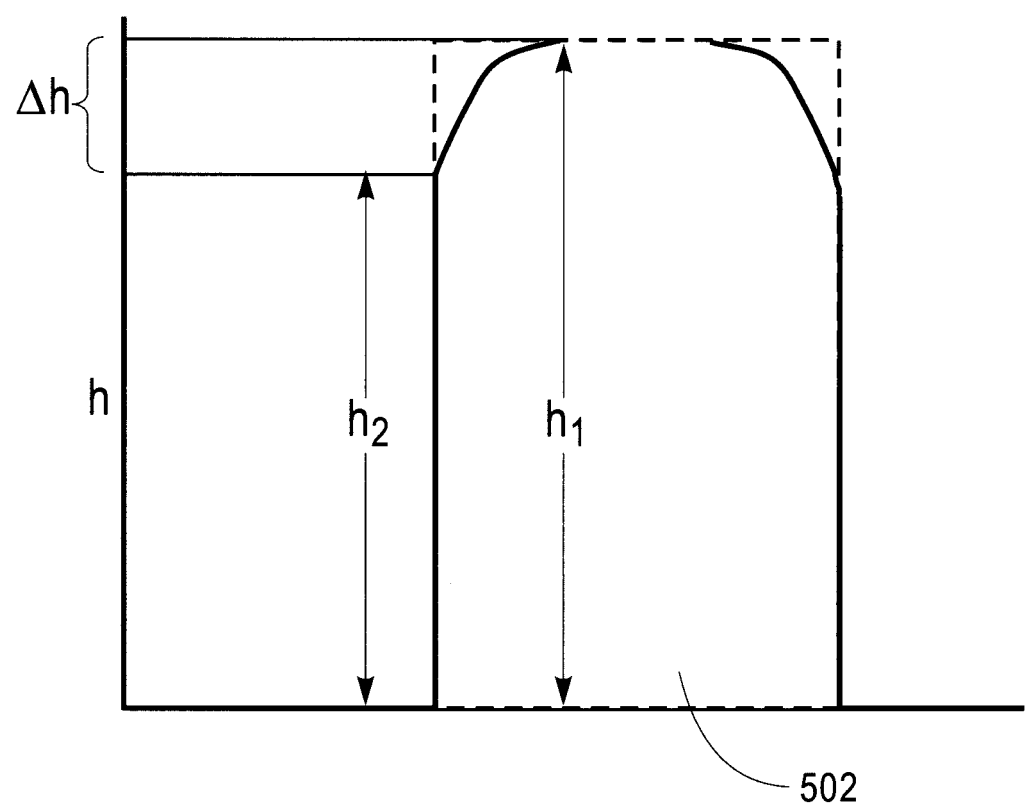
FIG. 5 is a diagram illustrating a cross-sectional view of a fin showing variations in fin height according to an embodiment of the present invention.

FIG. 5 is a diagram illustrating a cross-sectional view of a fin showing variations in fin height h. This cross-sectional view is, e.g., through a same plane of the present FinFET device as shown in FIG. 3A (described above), however magnified to show only a single fin 502. As described above, it is desirable to minimize variations in fin dimensions including fin height. As shown in FIG. 5, fin height is measured from a base to a top of each fin. Regardless of what process is used to mask and etch the fins, some amount of variation in fin height $\Delta h$ will be present due to rounding at the top of the fins. As shown in FIG. 5, $\Delta h$ is measured as a difference between a highest ($h_1$) and a lowest ($h_2$) value of h throughout the fin. According to an exemplary embodiment, $\Delta h$ is less than or equal to about five nm, e.g., less than or equal to about three nm.

FIG. 6 is a diagram illustrating FinFET devices 602 and planar field effect transistor (FET) devices 604 integrated on a single chip, i.e., chip 606. Chip 606 is an example of hybrid CMOS technology.

Like FinFET device 200 described, for example, in conjunction with the description of FIG. 2, above, each of FinFET devices 602 comprises a substrate, a gate stack, source/drain regions and fins between the source/drain regions. Each of planar FET devices 604 comprises source/drain regions with a channel in between and a gate stack separated from the channel by a gate oxide layer. The structure of a typical planar FET device is well known to those of ordinary skill in the art, and is not described further herein.

The present FinFET fabrication processes (see, for example, FIG. 1, described above) readily permit the instant FinFET devices to be fabricated along with planar FET devices on the same wafer. Namely, as will be described in detail below, gate patterning, gate dielectric formation and gate stack formation of the FinFET devices and the planar FET devices can occur at the same time.

Such a hybrid configuration is advantageous, for example, because it is much easier to make certain devices, such as analog FET devices, power devices and FET devices with different threshold voltages in planar FET devices. The finFET devices can then be optimized for a specific use, such as logic FET devices and static random access memory (SRAM) FET devices.

Traditional FinFET fabrication processes are very difficult to integrate with planar FET devices. For example, with FinFET devices, a hardmask is needed to protect the fins during RIE of the gate and/or spacers. However, with planar FET devices, the gate oxide layer is needed on top of the channel. Using traditional fabrication processes, the hardmask would have to be deposited on the fins and then separately removed from each planar FET device to deposit the gate oxide layer. This process is time consuming and impractical. With the present techniques, however, the gate is placed after RIE of the spacers, which means that there is a hardmask in place during spacer RIE, which is then removed before putting on the gate (see description of FIG. 1, above). Thus, it is easier to deposit the gate oxide layer on the planar FET devices.

Further, with regard to FinFET devices, a taller gate is required (as compared to a planar FET device) to cover a topology of the fins. Subsequent CMP is in most instances then needed to planarize the top of the gate. If epitaxial silicon growth is used to extend the source/drain regions, then a hardmask is needed over the gate to prevent epitaxial silicon from contacting the gate. RIE of the gate needs to clear fin sidewalls instead of just stopping as soon as it hits silicon. None of these processes are needed for planar FET devices. With the present techniques, however, the use of the dummy gate (see description of FIG. 1, above) eliminates topology differences between the finFET and the planar FET devices (the gate is the same for both), making integration of the two process technologies easier.

Also, with regard to FinFET devices, forming spacers can be a very complicated process, i.e., requiring a long over etch to clear the fin sidewalls. As a result, it is generally not feasible to make multiple spacers. With planar FET devices, by contrast, multiple spacers are often used. With the present techniques, however, fins are made only under the gate (see description of FIG. 1, above). Once the fins are covered with the gate, the device looks the same as a planar FET device and can be processed the same as a planar FET device, such as to add spacers.

Figure 7A:
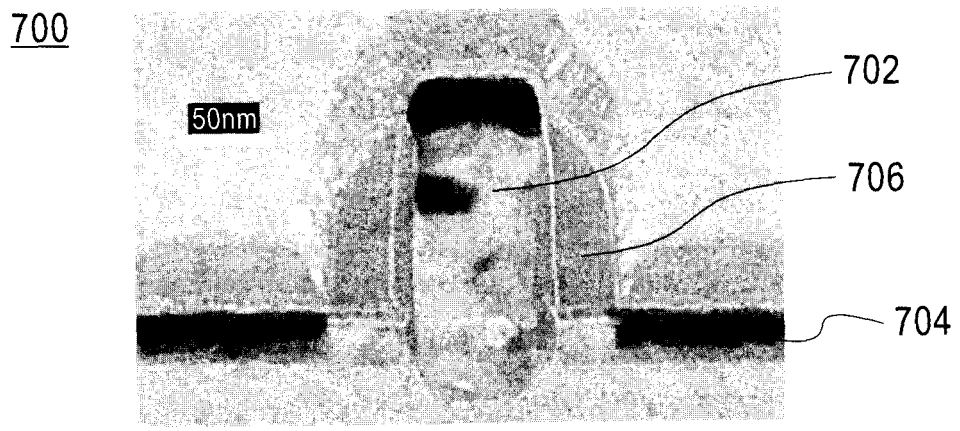
FIG. 7A is an image illustrating a cross-sectional view along a conducting path of an exemplary FinFET device according to an embodiment of the present invention.
Figure 7B:
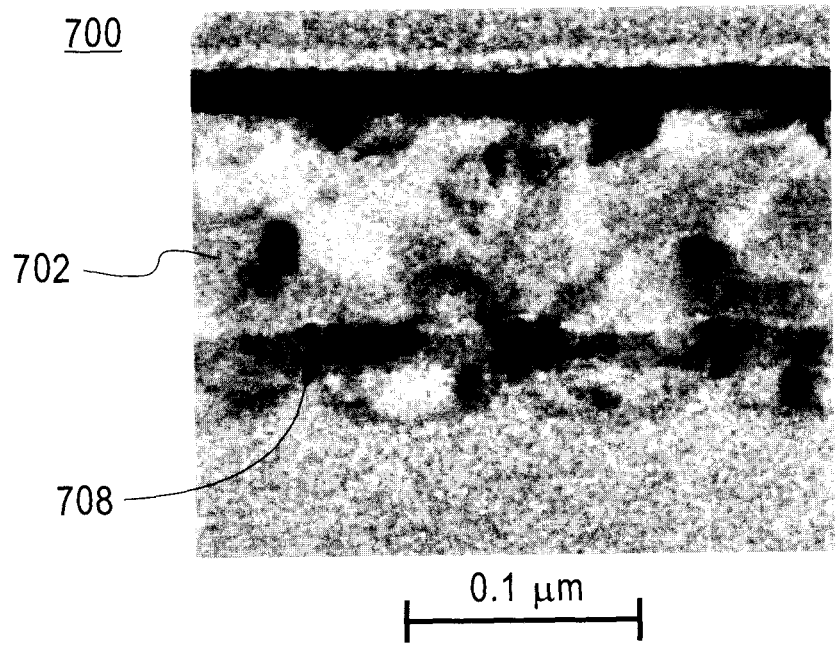
FIG. 7B is an image illustrating a cross-sectional view of the exemplary FinFET device of FIG. 7A showing fins embedded in a gate according to an embodiment of the present invention.

FIG. 7A is an image illustrating a cross-sectional view along a conducting path of exemplary FinFET device 700. FinFET device 700 was fabricated according to methodology 100, described in conjunction with the description of FIG. 1, above. As shown in FIG. 7, FinFET device 700 comprises gate 702, source/drain regions 704 and spacers 706. In this view, the device fins are hidden by the gate. FIG. 7B is an image illustrating a cross-sectional view of exemplary FinFET device 700 showing fins 708 embedded in gate 702.

Figure 8A:
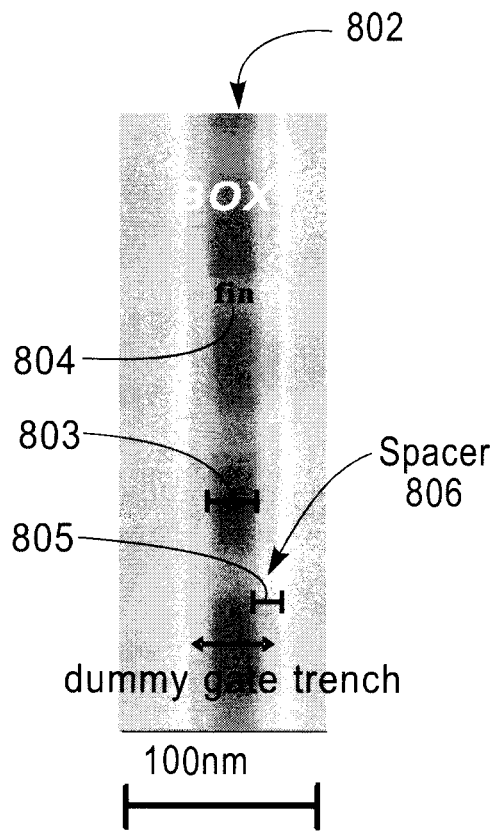
FIG. 8A is an image illustrating a top-down view of a gate trench after fin and spacer definition according to an embodiment of the present invention.
Figure 8B:
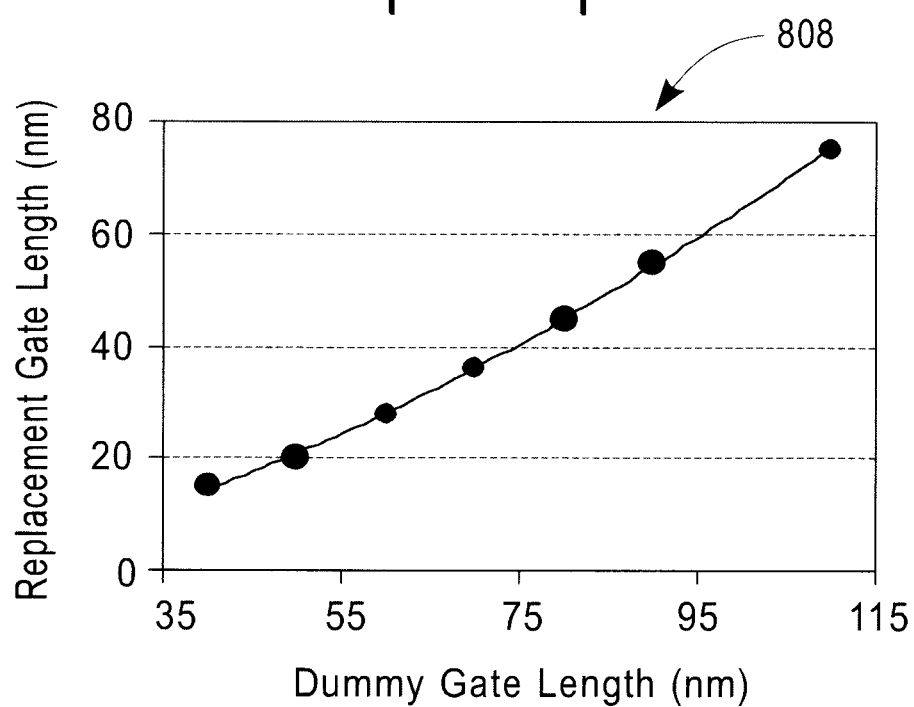
FIG. 8B is a graph illustrating a correlation between dummy gate length and replacement gate length according to an embodiment of the present invention.

FIG. 8A is an image illustrating a top-down view of gate trench 802 after fin 804 and spacer 806 definition using the present FinFET fabrication techniques. As shown in FIG. 8A, gate length is determined by both dummy gate length 803 and spacer length 805. FIG. 8B is a graph 808 illustrating a correlation between dummy gate length and replacement gate, i.e., device gate, length for the present FinFET devices. Data for graph 808 was compiled from top-down images of the gate trench after spacer definition, such as that shown in FIG. 8A.

Figure 9A:
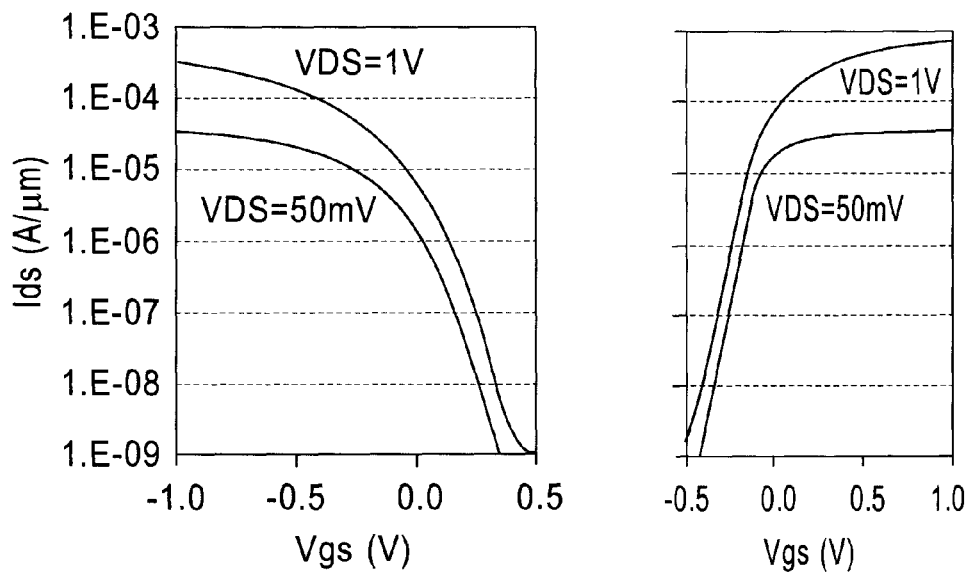
FIGS. 9A-B are graphs illustrating current-voltage characteristics of exemplary FinFET devices according to an embodiment of the present invention.
Figure 9B:
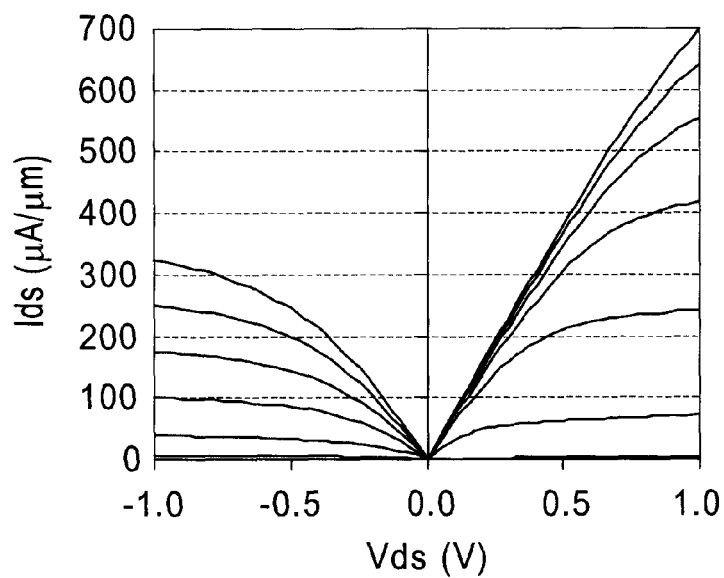

FIGS. 9A-B are graphs illustrating current-voltage (I-V) characteristics of exemplary FinFET devices fabricated according to the present techniques. In FIG. 9A, gate-source voltage ($V_{gs}$) (measured in Volts (V)) is plotted as a function of drain-source current ($I_{ds}$) (measured in Amps per micrometer (A/µm)) for both a drain-source voltage (VDS) of one V and a VDS of 50 millivolts (mV).

FIG. 9B is a graph illustrating output characteristics for negative channel field effect transistor (NFET) and positive channel field effect transistor (PFET) each with a gate length of about 28 nm. The NFET is doped with arsenic and the PFET is doped with borondiflouride ($BF_2$). In FIG. 9B, drain-source voltage (Vds) is plotted as a function of drain-source current (Ids).

Figure 10:
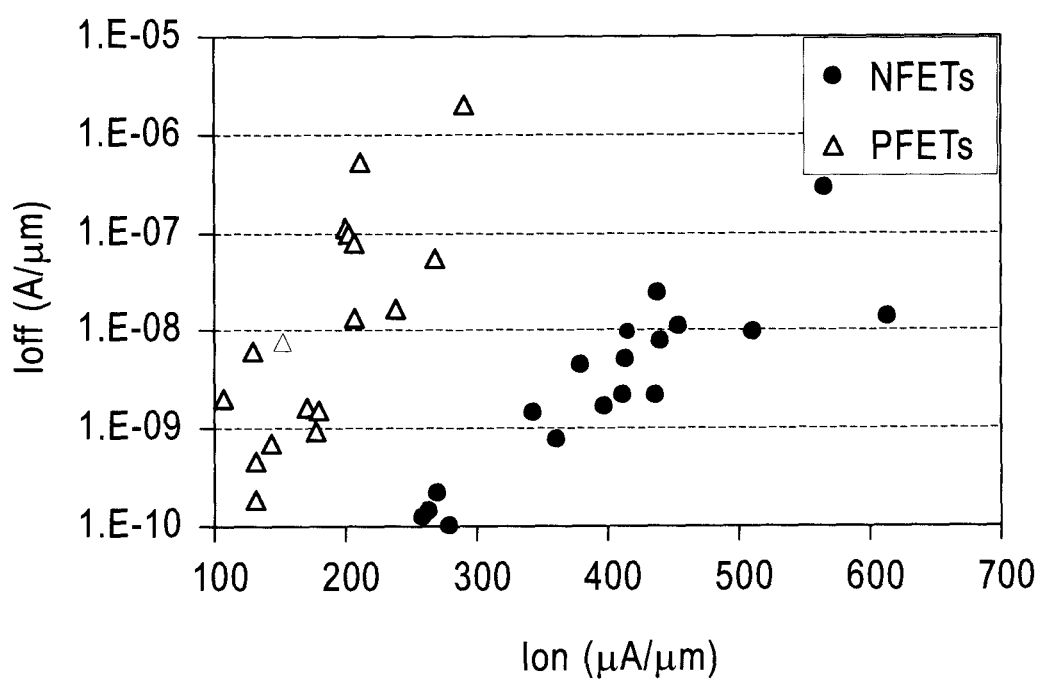
FIG. 10 is a graph illustrating a correlation of on-current to off-current according to an embodiment of the present invention.

FIG. 10 is a graph illustrating a correlation of on-current (Ion) (measured in A/µm) to off-current (Ioff) (measured in microamps (µA) per µm (µA/µm) (Ion/Ioff) for the present FinFET devices. PFET data is given for a drain-drain voltage ($V_{dd}$), i.e., power supplied, window of zero volts to one volt. NFET data is given for a $V_{dd}$ window of –0.15 volts to 0.85 volts.

Figure 11A:
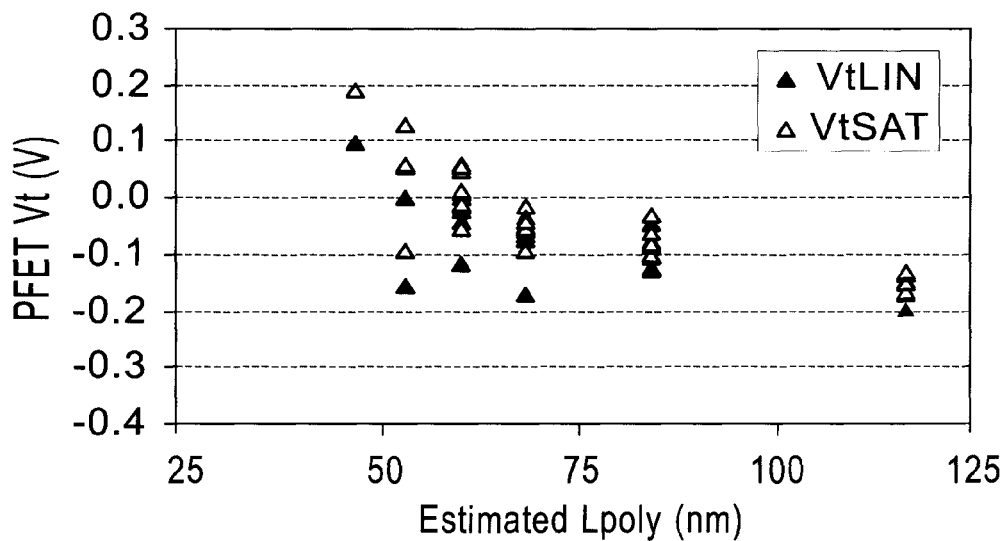
FIGS. 11A-D are graphs illustrating short channel behavior of exemplary FinFET devices according to an embodiment of the present invention.
Figure 11B:
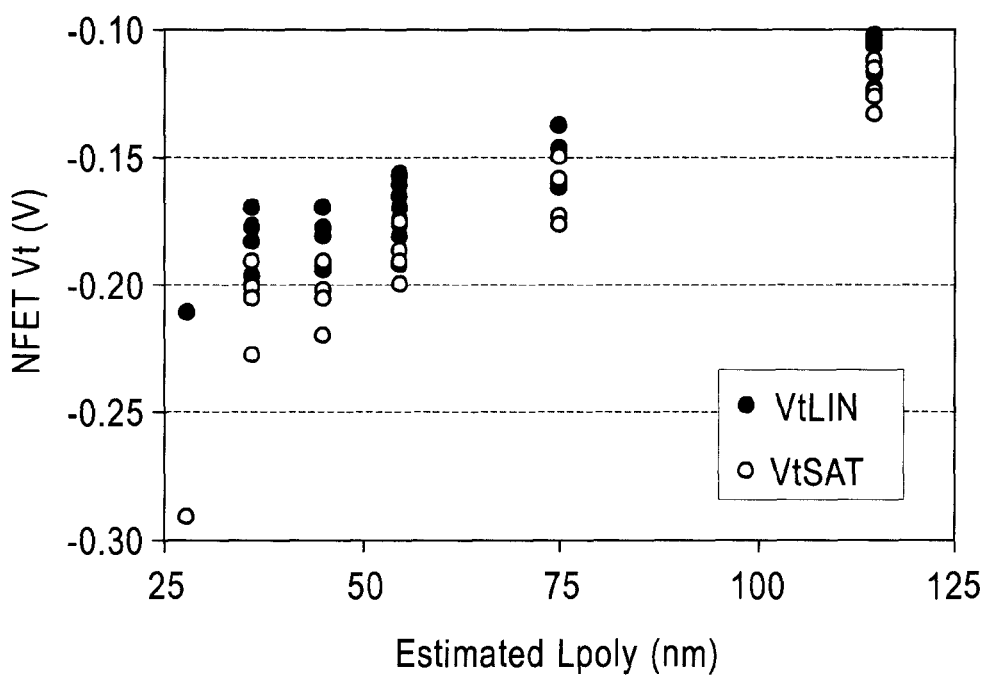
Figure 11C:
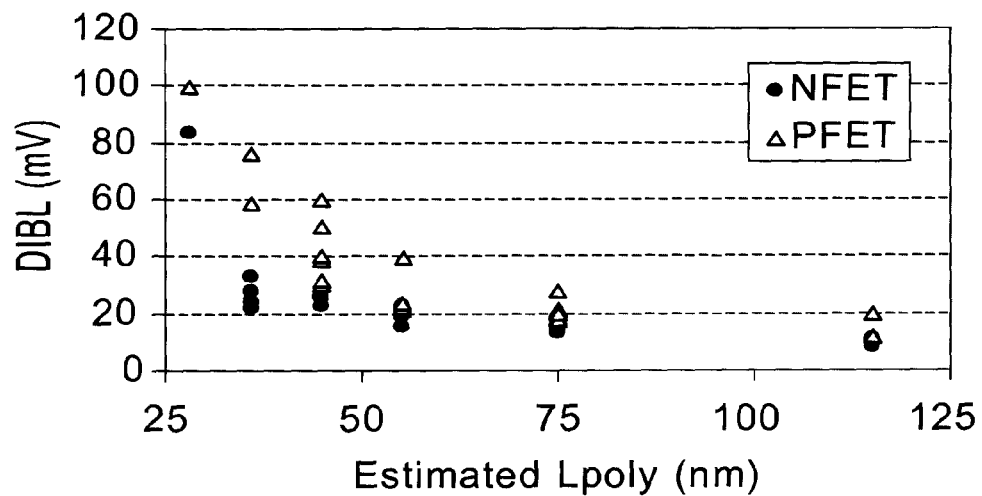
Figure 11D:
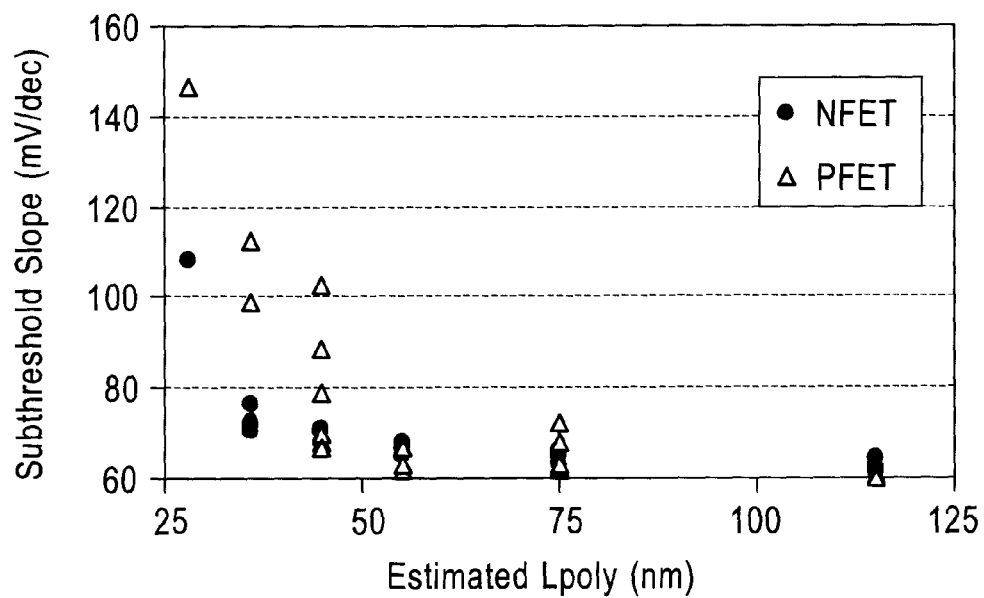

FIGS. 11A-D are graphs illustrating short channel behavior of exemplary FinFET devices fabricated according to the present techniques. In FIGS. 11A and 11B, PFET and NFET threshold voltages (Vt), respectively, are plotted as a function of estimated Lpoly (measured in nm), i.e., gate length, for both linear (VtLIN) and saturation (VtSAT) regions. In FIGS. 11C and 11D, drain induced barrier lowering (DIBL) (measured in millivolts) and subthreshold slope (measured in millivolts per decade (mV/dec)), respectively, are plotted as a function of estimated Lpoly. $V_T$ is extracted at a constant current of ten nanoamps per micrometer (nA/µm). Subthreshold slope is extracted at zero volts for PFET and –0.15 volts for NFET. Note that the FinFET devices are not centered due to undoped channels and polysilicon gate. $V_T$ roll-off as Lpoly is reduced is observed, which is consistent with undoped channels.

Figure 12:
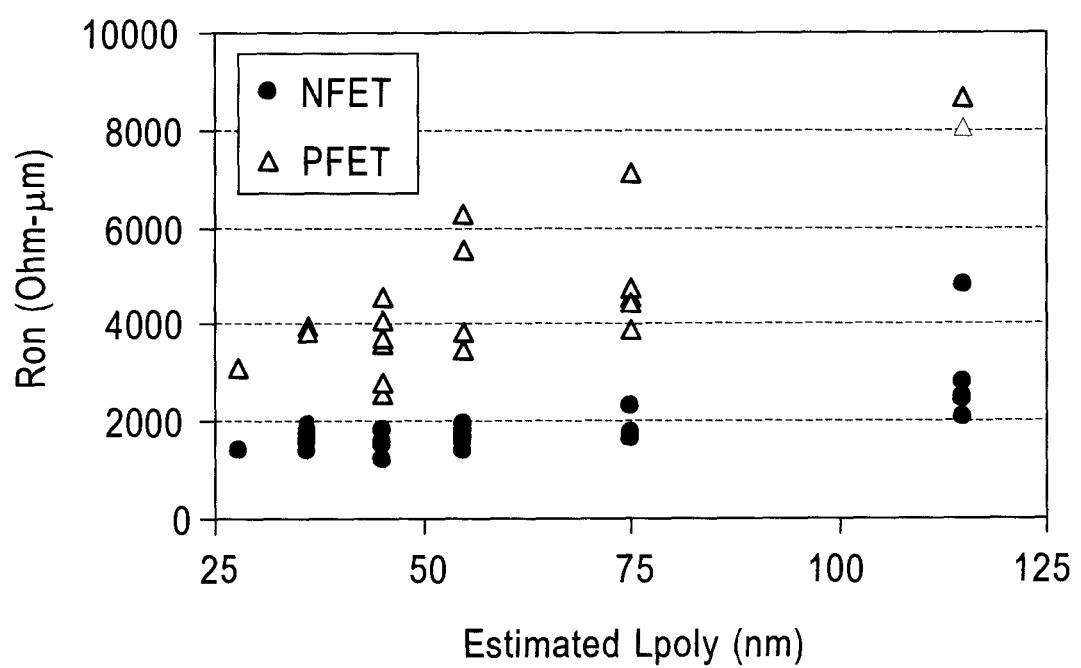
FIG. 12 is a graph illustrating external resistance extraction according to an embodiment of the present invention.

FIG. 12 is a graph illustrating external resistance ($R_{ext}$) extraction for the present FinFET devices. In FIG. 12, on-resistance (Ron), i.e., device resistance, (measured in Ohms-µm (Ω-µm)) is plotted as a function of estimated Lpoly (measured in nm). Ron is calculated at $V_{GS}=V_T+0.9V$, $V_{DS}=50$ mV. Extrapolated y-intercept gives $R_{ext}$ of approximately 750Ω-µm for NFETs and 950Ω-µm for PFETs.

Figure 13A:
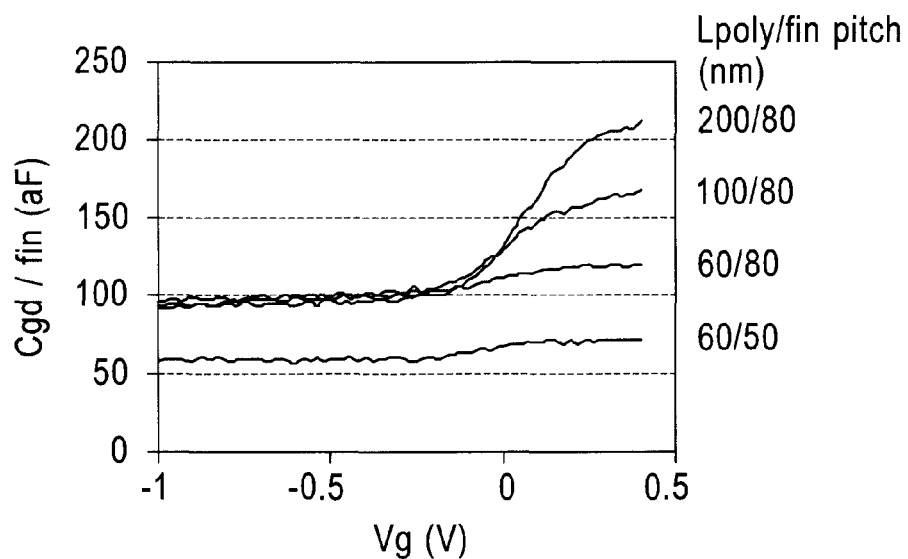
FIGS. 13A-C are graphs illustrating negative channel field effect transistor capacitance measurements according to an embodiment of the present invention.
Figure 13B:
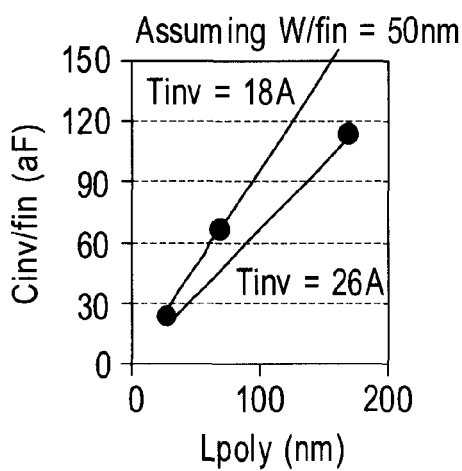
Figure 13C:
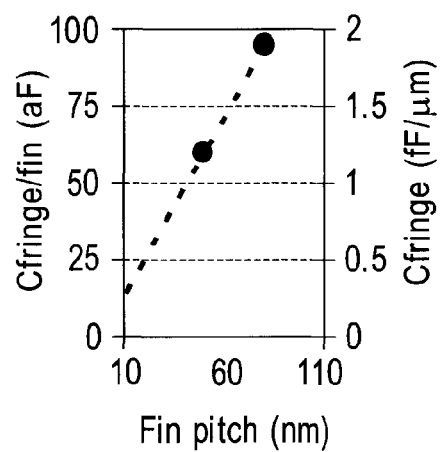

FIGS. 13A-C are graphs illustrating negative channel field effect transistor NFET capacitance measurements for the present FinFET devices. In FIG. 13A, gate-drain capacitance (Cgd) per fin (measured in attofarads (aF)) is plotted as a function of gate voltage (Vg) for different gate lengths (Lpoly) and fin pitches.

In FIG. 13B, inversion capacitance (Cinv) per fin (measured in aF) is plotted as a function of gate length (Lpoly) (measured in nm) for an inversion layer thickness of about 18 angstroms (A) and an inversion layer thickness of about 26A. FIG. 13B illustrates that Cinv is consistent with an inversion layer thickness of between about 18 A and about 26 A.

In FIG. 13C, fringe capacitance (Cfringe) per fin (measured in both aF and femtofarads per micrometer (fF/µm)) is plotted as a function of fin pitch (measured in nm). FIG. 13C illustrates the dependence of Cfringe on fin pitch.

Thus, while the better short channel effects offered by FinFETs may enable shorter gates and reduced $C_{inv}$, the gain from $C_{inv}$ reduction may be offset by increased parasitic fringe capacitance in FinFETs. Indeed, the capacitance-voltage (C-V) curves in FIG. 13A reveal high off-state capacitance values. This off-state capacitance includes direct overlap capacitance, fringe capacitances, and capacitance between the gate and contact studs. Of these various components, only fringe capacitance is expected to scale with fin pitch, so the dependence of off-state capacitance on fin pitch (FIG. 13C) allows the fringe capacitance to be inferred.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A field effect transistor device comprising:
   a source region;
   a drain region;
   a plurality of fins connecting the source region and the drain region, the fins having a pitch of between about 40 nanometers and about 200 nanometers and each of the fins having a width of between about ten nanometers and about 40 nanometers, and wherein each of the fins has a height variation of less than or equal to about five nanometers with the height variation in a given one of the fins being measured as a difference between a highest height value and a lowest height value throughout the given fin;

a gate stack over at least a portion of the fins, wherein the source region and the drain region are self-aligned with the gate stack; and spacers present between the source region and the gate stack and between the drain region and the gate stack, wherein the spacers are formed from silicon dioxide, and wherein the spacers i) cover fin extension regions between the source region and the gate stack and between the drain region and the gate stack and ii) extend over and are in direct contact with a top surface of each of the source region and the drain region such that the spacers offset the gate stack from the source region and the drain region as well as cover a portion of each of the source region and the drain region.

2. The device of claim 1, wherein the spacers extend a distance of between about 10 nm to about 40 nm over each of the source region and the drain region.

3. The device of claim 1, further comprising a spacer layer between one or more of the fins and the gate stack.

4. The device of claim 1, further comprising a silicide region on one or more of the source and drain regions.

5. The device of claim 1, further comprising deep implants in the source region and in the drain region.

6. The device of claim 5, further comprising a silicide region on the source region and on the drain region which extends into the deep implants in the source region and in the drain region.

7. The device of claim 6, wherein the silicide region is present at the top surface of each of the source region and the drain region except for the portion of each of the source region and the drain region covered by the spacers.

8. The device of claim 1, wherein the spacers are in direct contact with between about 10 nm to about 40 nm of the top surface of each of the source region and the drain region.

9. A semiconductor device comprising:

a chip having plurality of field effect transistor devices thereon, wherein the plurality of field effect transistor devices include at least one planar field effect transistor and at least one fin field effect transistor, wherein the at least one fin field effect transistor comprises:

a source region;

a drain region;

a plurality of fins connecting the source region and the drain region, the fins having a pitch of between about 40 nanometers and about 200 nanometers and each of the fins having a width of between about ten nanometers and about 40 nanometers, and wherein each of the fins has a height variation of less than or equal to about five nanometers with the height variation in a given one of the fins being measured as a difference between a highest height value and a lowest height value throughout the given fin;

a gate stack over at least a portion of the fins, wherein the source region and the drain region are self-aligned with the gate stack; and spacers present between the source region and the gate stack and between the drain region and the gate stack, wherein the spacers are formed from silicon dioxide, and wherein the spacers i) cover fin extension regions between the source region and the gate stack and between the drain region and the gate stack and ii) extend over and are in direct contact with a top surface of each of the source region and the drain region such that the spacers offset the gate stack from the source region and the drain region as well as cover a portion of each of the source region and the drain region.

10. The semiconductor device of claim 9, comprising a plurality of the fin field effect transistor devices, at least two of which are positioned adjacent one another on the semiconductor wafer and are configured to have a gate pitch of between about 180 nm and about 200 nm.

* * * * *